(12) United States Patent
Shioga et al.

(10) Patent No.: US 11,536,518 B2
(45) Date of Patent: Dec. 27, 2022

(54) FABRICATION METHOD FOR LOOP HEAT PIPE

(71) Applicant: FUJITSU LIMITED, Kawasaki (JP)

(72) Inventors: Takeshi Shioga, Atsugi (JP); Tomoyuki Abe, Isehara (JP)

(73) Assignee: Fujitsu Limited, Kawasaki (JP)

( * ) Notice: Subject to any disclaimer, the term of this patent is extended or adjusted under 35 U.S.C. 154(b) by 113 days.

(21) Appl. No.: 17/104,386

(22) Filed: Nov. 25, 2020

(65) Prior Publication Data
US 2021/0080192 A1 Mar. 18, 2021

Related U.S. Application Data

(60) Division of application No. 15/895,232, filed on Feb. 13, 2018, now Pat. No. 10,881,021, which is a
(Continued)

(51) Int. Cl.
*B21D 53/02* (2006.01)
*B23P 15/26* (2006.01)
(Continued)

(52) U.S. Cl.
CPC ........... *F28D 15/043* (2013.01); *B21D 53/02* (2013.01); *B23P 15/26* (2013.01);
(Continued)

(58) Field of Classification Search
CPC ..... B21D 53/02; B23P 2700/09; F28D 15/043
See application file for complete search history.

(56) References Cited

U.S. PATENT DOCUMENTS 7,775,261 B2 * 8/2010 Valenzuela ......... F28D 15/0233
165/104.21
7,836,597 B2 * 11/2010 Datta .................. H01L 21/4882
29/890.032
(Continued)

FOREIGN PATENT DOCUMENTS

CN 202329315 U 7/2012
CN 104457354 A * 3/2015 ......... F28D 15/0233
(Continued)

OTHER PUBLICATIONS

Office Action of Japanese Patent Application No. 2017-537160 dated Aug. 7, 2018 (4 pages, 3 pages translation, 7 pages total)/ Partial Machine translation.
(Continued)

*Primary Examiner* — Jacob J Cigna
(74) *Attorney, Agent, or Firm* — Kratz, Quintos & Hanson, LLP

(57) ABSTRACT

A evaporator of a loop heat pipe includes a liquid inlet side portion that extends in a widthwise direction crossing with a lengthwise direction from a liquid inlet side to a vapor outlet side, a plurality of portions that continue to the liquid inlet side portion and extend in the lengthwise direction, a plurality of vapor flow paths that are provided between the plurality of portions and extend in the lengthwise direction, and a vapor outlet side vapor flow path that extends in the widthwise direction and continues to the vapor flow paths. Each of the plurality of portions includes a first groove communicating two adjacent ones of the vapor flow paths.

3 Claims, 25 Drawing Sheets

Related U.S. Application Data continuation of application No. PCT/JP2015/075081, filed on Sep. 3, 2015.

(51) Int. Cl.

| | | |
|---|---|---|
| *F28D 15/02* | (2006.01) | |
| *F28D 15/04* | (2006.01) | |
| *G06F 1/20* | (2006.01) | |
| *H01L 23/427* | (2006.01) | |
| *H05K 7/20* | (2006.01) | |

(52) U.S. Cl.
CPC ....... *F28D 15/0266* (2013.01); *F28D 15/046* (2013.01); *G06F 1/203* (2013.01); *H01L 23/427* (2013.01); *H05K 7/20309* (2013.01); *H05K 7/20318* (2013.01); *H05K 7/20327* (2013.01); *H05K 7/20336* (2013.01); *B23P 2700/09* (2013.01)

(56) References Cited

U.S. PATENT DOCUMENTS

| | | | | |
|---|---|---|---|---|
| 8,919,426 | B2 * | 12/2014 | Hardesty | F28D 15/0233 165/104.21 |
| 8,997,840 | B2 * | 4/2015 | Yang | B05D 5/04 165/104.26 |
| 9,551,538 | B2 * | 1/2017 | Honmura | G06F 1/203 |
| 2004/0179338 | A1 | 9/2004 | Belady | |
| 2005/0047090 | A1 | 3/2005 | Tonosaki | |
| 2007/0227704 | A1 | 10/2007 | Nagai | |
| 2008/0210405 | A1 * | 9/2008 | Datta | F28D 15/0266 257/E23.098 |
| 2010/0326632 | A1 | 12/2010 | Nagai | |
| 2012/0181005 | A1 * | 7/2012 | Downing | F28F 3/086 165/170 |
| 2015/0077929 | A1 | 3/2015 | Honmura | |
| 2016/0259383 | A1 | 9/2016 | Shioga | |

FOREIGN PATENT DOCUMENTS

| | | | | |
|---|---|---|---|---|
| CN | 104596334 | A * | 5/2015 | ......... F28D 15/0233 |
| CN | 104735956 | A * | 6/2015 | ......... F28D 15/0233 |
| JP | H08-313178 | A | 11/1996 | |
| JP | 2003-185369 | A | 7/2003 | |
| JP | 2004-063684 | A | 2/2004 | |
| JP | 2007-266153 | A | 10/2007 | |
| JP | 2012-043954 | A | 3/2012 | |
| JP | 2015-059693 | A | 3/2015 | |
| JP | 2015-090247 | A | 5/2015 | |
| KR | 200349192 | A | 6/2003 | |
| WO | 2015087451 | A1 | 6/2015 | |

OTHER PUBLICATIONS

Fukushima, et al.; "Study of a Micro Loop Heat Pipe (Proposal of A New Evaporator Structure)"; Proceedings of Thermal Engineering Conference, Japan; The Japan Society of Mechanical Engineers; Nov. 7, 2014; No. 14-59/Cited in JP-OA dated Aug. 7, 2018 for corr. Appl. No. 2017-537160.

International Search Report for International Application No. PCT/JP2015/075081 dated Dec. 8, 2015 (2 Sheets).

Written Opinion of the International Searching Authority for International Application No. PCT/JP2015/075081 dated Dec. 8, 2015 (4 Sheets, 2 Sheets Partial English translation, 6 Sheets total).

\* cited by examiner

FABRICATION METHOD FOR LOOP HEAT PIPE

CROSS-REFERENCE TO RELATED APPLICATION

This application is a continuation application of International Application PCT/JP2015/075081 filed on Sep. 3, 2015 and designated the U.S., the entire contents of which are incorporated herein by reference.

FIELD

The embodiments discussed herein are related to a loop heat pipe and a fabrication method therefor, and an electronic device.

BACKGROUND

In a small and thin electronic device for mobile applications such as, for example, a smartphone or a tablet computer, in order to cool a heat-generating component, a sheet-type heat conductive member such as, for example, a metal plate or a thermal diffusion sheet is widely used. For example, though copper, aluminum, magnesium alloy, a stacked thin plate formed from such metals or the like is used as the metal plate, heat conduction of the metal plates is restricted by a physical property value of their material. Further, however for example, a graphite sheet is used as a thermal diffusion sheet, the thermal conductivity is approximately 500 to 1500 W/mK, and there is the possibility that such a level of the thermal conductivity as just described may result in failure to cope with increase of the heat generation of a heat-generating component.

Therefore, in order to efficiently move and diffuse a large amount of heat, it seems a recommendable idea to utilize a heat pipe that is a heat transfer device which uses latent heat by a vapor-liquid two-phase flow. For example, for a heat pipe having a diameter of approximately 3 to 4 mm, the equivalent thermal conductivity of a heat pipe corresponds to approximately 1500 to 2500 W/mK and exhibits a high heat conduction compared with that of a sheet-like heat conductive member.

In order to transfer heat efficiently, it is effective to increase the diameter of a pipe, however, this makes an obstacle upon mounting, and application to a mobile electronic device does not advance.

In this case, although it seems recommendable to flatten the pipe shape of the heat pipe, such flattening obstructs the flow of working fluid in the heat pipe and degrades the performance of heat transport, and the equivalent thermal conductivity of a heat pipe decreases to a level of approximately 500 to 1500 W/mK.

In contrast, in a loop heat pipe, flow paths for working fluid of the vapor phase and working fluid of the liquid phase are independent of each other and working fluid flows in one direction in the flow paths. Therefore, in comparison with a heat pipe in which working fluid of the vapor phase and working fluid of the liquid phase reciprocate in the one pipe, the flow resistance to the working fluid can be reduced and efficient heat transport can be implemented.

Therefore, it seems recommendable to use a loop heat pipe in an electronic device for mobile applications.

SUMMARY

According to an aspect of the embodiment, a loop heat pipe includes an evaporator in which working fluid of the liquid phase evaporates, a condenser in which working fluid of the vapor phase condenses, a vapor line that couples the evaporator and the condenser and through which the working fluid of the vapor phase flows, and a liquid line that couples the condenser and the evaporator and through which the working fluid of the liquid phase flows, wherein the evaporator includes a liquid inlet to which the liquid line is coupled, a vapor outlet to which the vapor line is coupled, a liquid inlet side portion that is provided at the side of the liquid inlet and extends in a widthwise direction crossing with a lengthwise direction from the side of the liquid inlet to the side of the vapor outlet, a plurality of portions that continue to the liquid inlet side portion and extend in the lengthwise direction, a plurality of vapor flow paths that are provided between the plurality of portions and extend in the lengthwise direction, and a vapor outlet side vapor flow path that is provided at the side of the vapor outlet, extends in the widthwise direction and continues to the plurality of vapor flow paths, each of the plurality of portions includes a first groove communicating two adjacent ones of the plurality of vapor flow paths with each other.

According to an aspect of the embodiment, an electronic device includes a heat-generating component, and a loop heat pipe that cools the heat-generating component, and the loop heat pipe is configured in such a manner as described above.

According to an aspect of the embodiment, a fabrication method for a loop heat pipe includes processing a region of a first plate-like member, in which an evaporator is to be formed, to form, in a region in which a plurality of portions extending in a lengthwise direction from the side of a liquid inlet toward the side of a vapor outlet of the region serving as the evaporator are to be formed, a first groove extending in a widthwise direction crossing with the lengthwise direction and capable of generating capillary force such that, from among regions in which a plurality of vapor flow paths are to be formed provided between the regions in which the plurality of portions are to be formed, regions in which two vapor flow paths adjacent to each other are to be formed are communicated with each other, form, in a region in which a liquid inlet side portion is to be formed, a third groove extending in the widthwise direction and capable of generating capillary force and form a first wide groove having a width greater than those of the first groove and the third groove in the region in which the plurality of vapor flow paths are to be formed and a region in which a vapor outlet side vapor flow path is to be formed, processing a region of a second plate-like member, in which the evaporator is to be formed, to form, in the region in which the plurality of portions are to be formed, a second groove extending in the lengthwise direction and capable of generating capillary force, form, in a region continuing to the liquid inlet and a region which each of the plurality of portions continues included in the region in which the liquid inlet side portion is to be formed, a fourth groove extending in the lengthwise direction and capable of generating capillary force, and form, in the region in which the plurality of vapor flow paths are to be formed and the region in which the vapor outlet side vapor flow path is to be formed, a second wide groove having a width greater than those of the second groove and the fourth groove, and joining the first plate-like member and the second plate-like member together such that the side having the first groove, third groove and first wide groove and the side having the second groove, fourth groove and second wide groove are opposed each other.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Incidentally, in order to provide a loop heat pipe in a small and thin electronic device for mobile applications, the thickness of the loop heat pipe are reduced.

However, it has been found that, if the thickness of the loop heat pipe is reduced, then such a situation occurs that the temperature and the pressure become non-uniform in the evaporator of the loop heat pipe, and as a result, fluid flow of the vapor phase from the evaporator does not become uniform and it takes much time to start the operation of the loop heat pipe (namely, heat transfer from the evaporator to the condenser).

Therefore, it is desired to shorten the start-up time for heat transfer in the loop heat pipe which is reduced its thickness.

In the following, a loop heat pipe and a fabrication method for the loop heat pipe, and an electronic device according to the present embodiment are described with reference to the drawings.

First, the loop heat pipe according to the present embodiment is described with reference to FIGS. 1 to 25.

The loop heat pipe according to the present embodiment is a thin loop heat pipe that is provided in an electronic device used for small and thin mobile applications such as, for example, a smartphone or a tablet computer and transfers heat generated in a heat-generating component (for example, an LSI chip) provided in the electronic device to cool the heat-generating component that is a heat source. It is to be noted that a small and thin electronic device for mobile applications is hereinafter referred to also as mobile device. Further, a heat-generating component is hereinafter referred to also as electronic component or heat-generating device.

Figure 2:
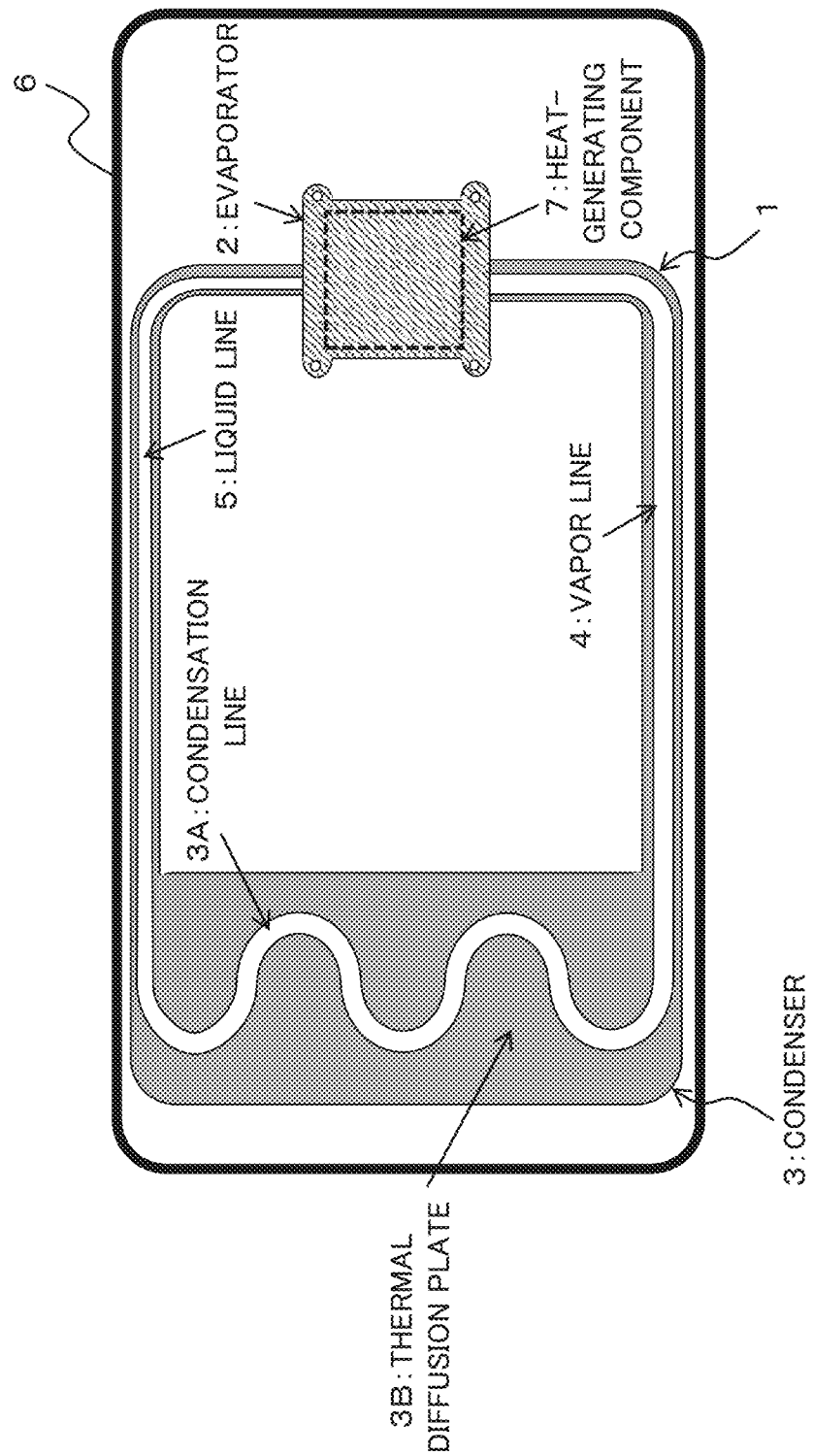
FIG. 2 is a schematic view depicting a configuration of an electronic device that includes the loop heat pipe according to the embodiment.
Figure 3:
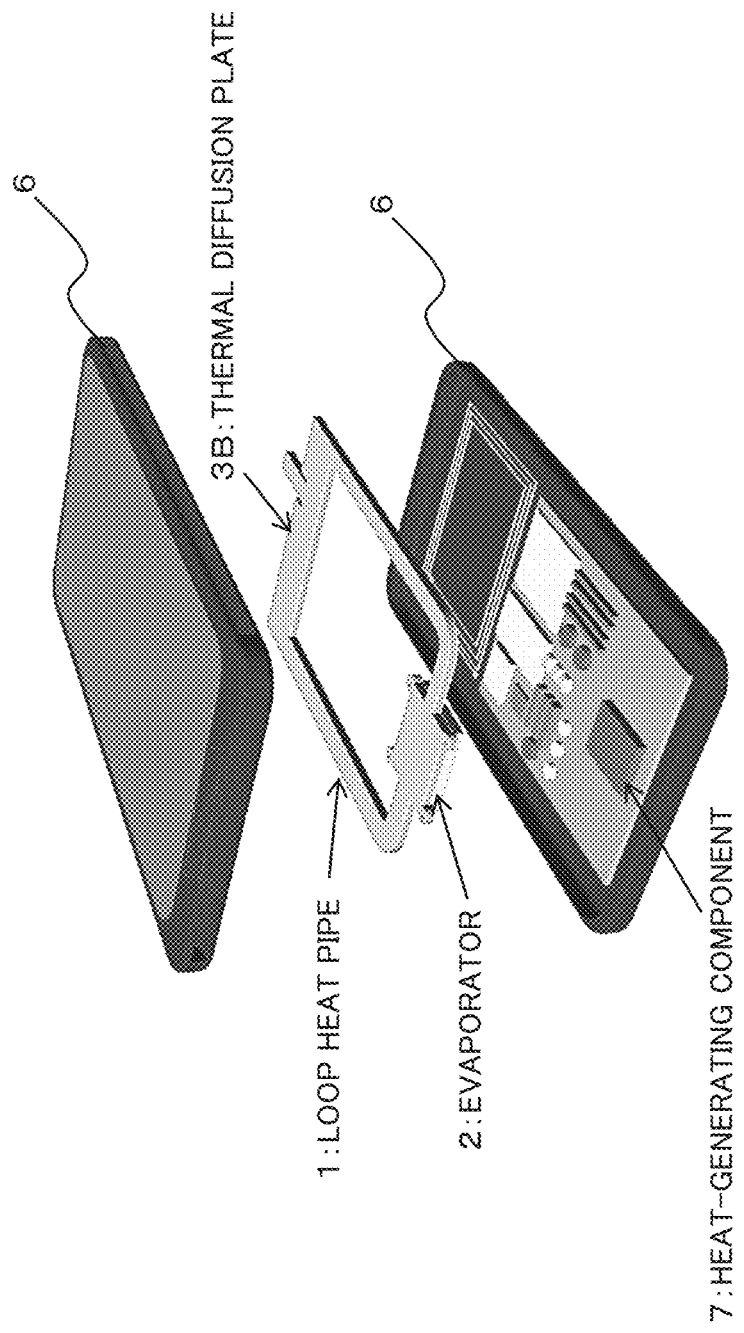
FIG. 3 is a schematic view depicting a configuration of the electronic device that includes the loop heat pipe according to the embodiment.

As depicted in FIG. 2, the loop heat pipe of the present embodiment includes an evaporator 2 in which working fluid of the liquid phase is evaporated, a condenser 3 in which working fluid of the vapor phase is condensed, a vapor line 4 that couples the evaporator 2 and the condenser 3 to each other and through which working fluid of the vapor phase flows, and a liquid line 5 that couples the condenser 3 and the evaporator 2 to each other and through which working fluid of the liquid phase flows. Here, the condenser 3 includes a condensation line 3A and a heat diffusion plate (heat radiation plate) 3B. As depicted in FIGS. 2 and 3, the loop heat pipe 1 configured as described above is accommodated in the inside of a mobile device 6 such that the evaporator 2 is thermally coupled to a heat-generating component 7 provided in the mobile device 6. It is to be noted that the working fluid is, for example, water, ethanol, acetone, methanol, Freon or the like.

Here, the evaporator 2 has one liquid inlet and one vapor outlet, and the condenser 3 has one vapor inlet and one liquid outlet. The vapor outlet of the evaporator 2 and the vapor inlet of the condenser 3 are coupled to each other through the vapor line 4, and the liquid outlet of the condenser 3 and the liquid inlet of the evaporator 2 are coupled to each other through the liquid line 5. In particular, the evaporator 2, vapor line 4, condenser 3, and liquid line 5 are coupled in a loop to each other, and working fluid sealed in the inside thereof flows in one direction. Here, the working fluid changes from the liquid phase to the vapor phase by heat supplied from the heat-generating component 7 to the evaporator 2 and moves to the condenser 3 through the vapor line 4 together with the heat, and the working fluid changes from the vapor phase to the liquid phase by heat radiation therefrom in the condenser 3 and returns to the evaporator 2 through the liquid line 5. Therefore, in comparison with a heat pipe in which working fluid of the liquid phase and working fluid of the vapor phase move back and forth in the pipe, the flow resistance to the working fluid can be reduced and efficient heat transport can be achieved.

Figure 7:
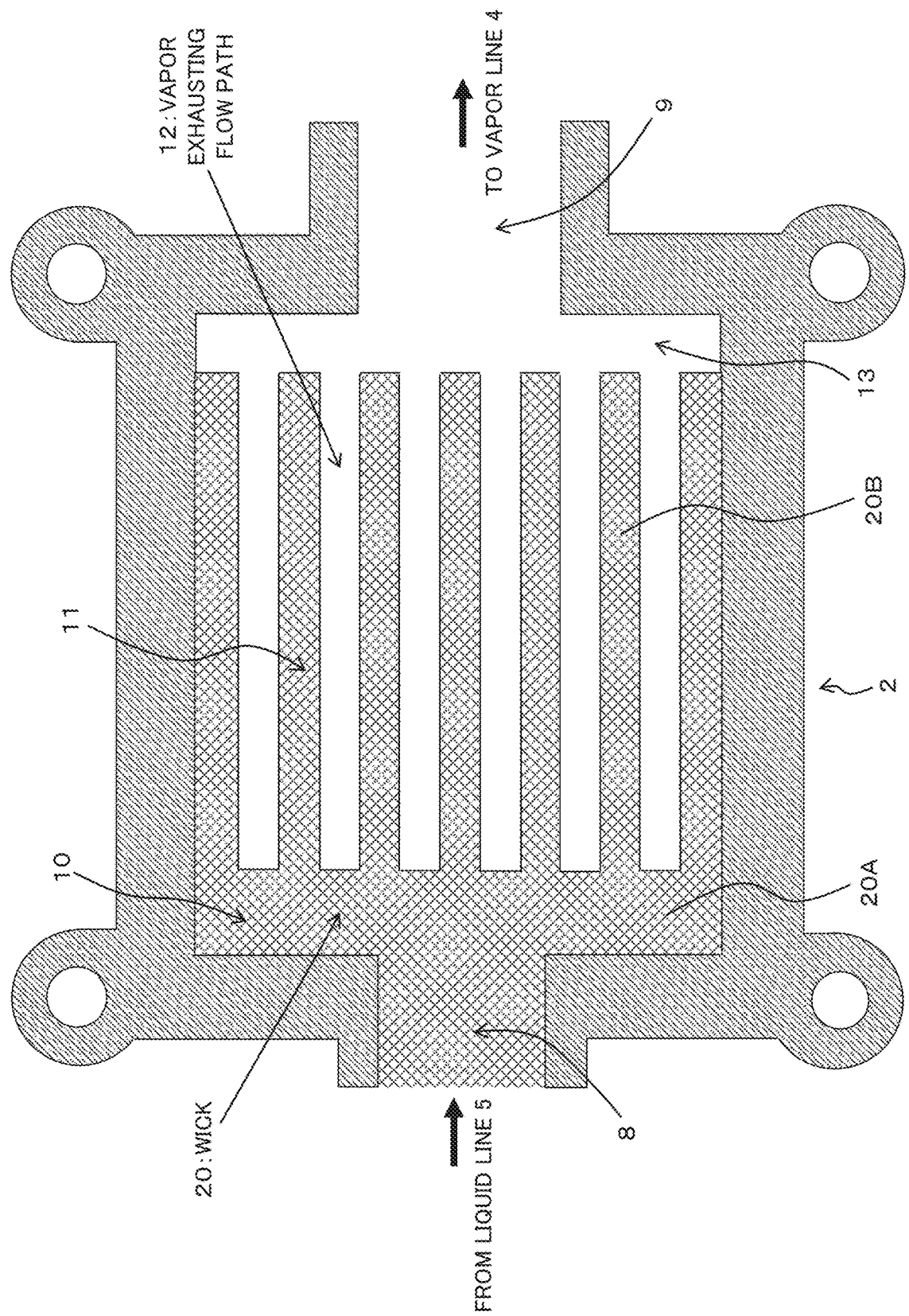
FIG. 7 is a schematic view illustrating a configuration of a wick provided in the inside of the evaporator provided in the loop heat pipe that uses six thin metal plates.

Further, as depicted in FIG. 7, the evaporator 2 includes a liquid inlet 8 to which the liquid line 5 is coupled, a vapor outlet 9 to which the vapor line 4 is coupled, a liquid inlet side portion 10 and a plurality of portions 11 in which the working fluid of the liquid phase permeates and changes to the vapor phase, and a plurality of vapor flow paths 12 and a vapor outlet side vapor flow path 13 through which the working fluid of the vapor phase flows.

Here, the liquid inlet side portion 10 is a portion that is provided at the liquid inlet 8 side and extends in the widthwise direction crossing with a lengthwise direction from the side of the liquid inlet 8 toward the side of the vapor outlet 9 and in which capillary force is generated such that the working fluid of the liquid phase permeates and changes to the working fluid of the vapor phase. It is to be noted that the lengthwise direction is hereinafter referred to also as lengthwise direction of the evaporator 2. Further, the widthwise direction is hereinafter referred to also as widthwise direction of the evaporator 2. Further, since a structure body is provided at the liquid inlet side portion 10, the structure body is hereinafter referred to also as liquid inlet side structure body.

Further, the plurality of portions 11 are portions that are continuous to the liquid inlet side portion 10 and extend in the lengthwise direction and in which capillary force is generated and the working fluid of the liquid phase permeates to change to the working fluid of the vapor phase. Here, the plurality of portions 11 are comb tooth-shaped portions, namely, a plurality of portions having a comb tooth shape. It is to be noted that, since a structure body is provided on the plurality of portions 11, the plurality of portions 11 are hereinafter referred to also as plurality of structure bodies.

Further, the plurality of vapor flow paths 12 are provided between the plurality of portions 11 and extend in the lengthwise direction such that the working fluid of the vapor phase flows therealong. In particular, the plurality of vapor flow paths 12 and the plurality of portions 11 are disposed alternately in an in-plane direction, and, as a result, reduction in thickness of the evaporator 2 is achieved. It is to be noted that, since the vapor flow paths 12 are flow paths for discharging the working fluid of the vapor phase flowing in the inside of the evaporator 2 to the vapor line 4 therethrough, the plurality of vapor flow paths 12 are hereinafter referred to also as vapor flow paths.

Further, the vapor outlet side vapor flow path 13 is provided at the side of the vapor outlet 9 and extends in the widthwise direction, and continues to the plurality of vapor flow paths 12 such that the working fluid of the vapor phase flows therein.

Figure 1:
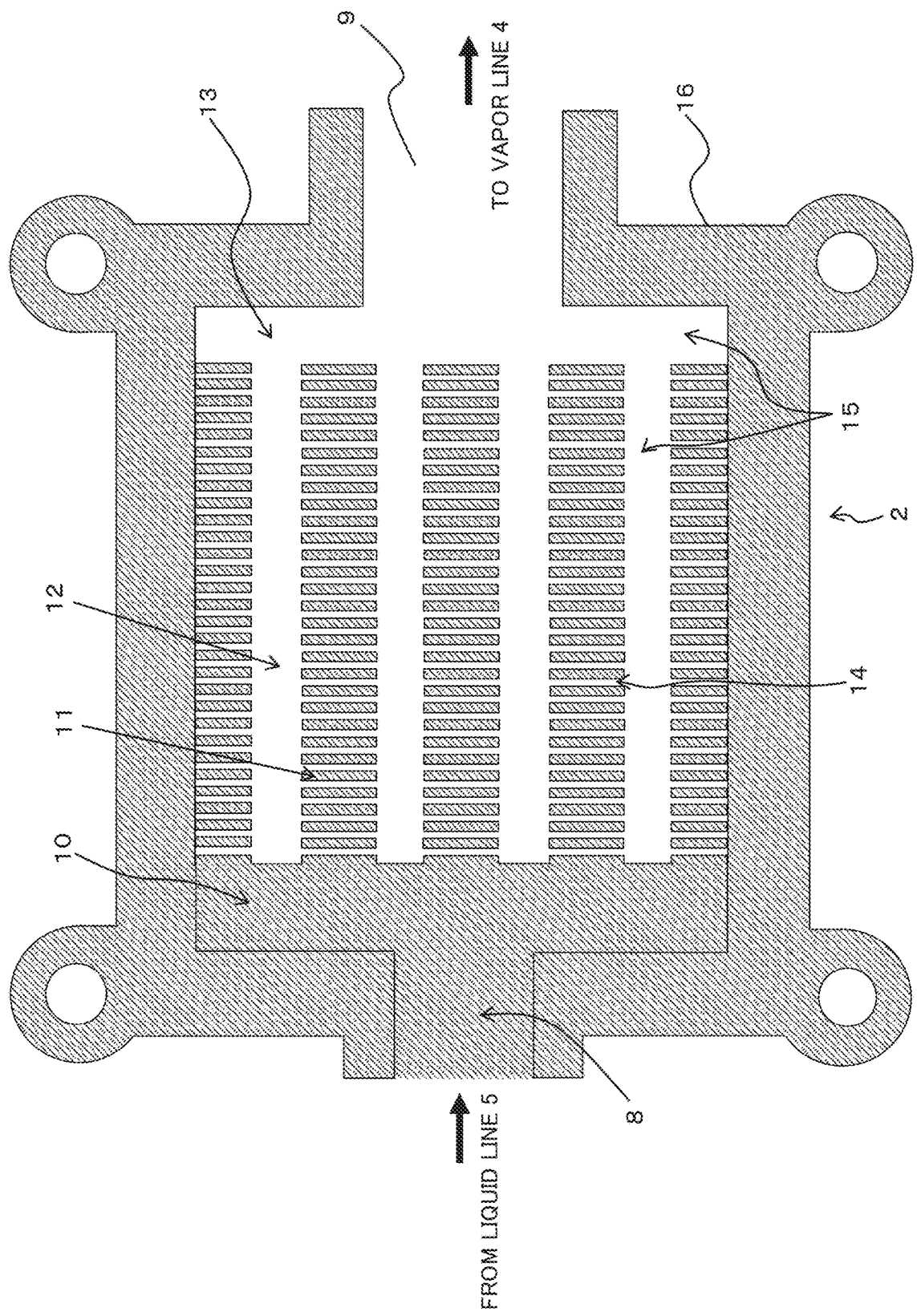
FIG. 1 is a schematic view depicting an example of a configuration of an evaporator provided in a loop heat pipe according to an embodiment.

Especially, as depicted in FIG. 1, each of the plurality of portions 11 includes a first groove 14 for communicating two vapor flow paths adjacent to each other from among the plurality of vapor flow paths 12. Since the vapor flow paths 12 adjacent to each other are communicated with each other by the first groove 14 in this manner, a pressure difference between the vapor flow paths 12 disappears, and the working fluid of the vapor phase generated by heat from the heat-generating component 7 that is a heat source is discharged uniformity. Consequently, the start-up time period of the loop heat pipe 1 can be reduced.

In particular, the evaporator 2 may be configured so as to include a first plate-like member 16 having a first groove 14 and a wide groove 15 that has a width greater than that of the first groove 14 and serves as part of the plurality of vapor flow paths 12 and the vapor outlet side vapor flow path 13. Here, the first plate-like member 16 is a metal plate and particularly is a copper plate. Further, the first plate-like member 16 has the first groove 14 and the wide groove 15 provided so as to have a depth smaller than the plate thickness of the plate by processing such as, for example, half etching. Here, as the first groove 14, a plurality of grooves extending in the widthwise direction are provided in a juxtaposed relationship in parallel to each other in the lengthwise direction. Further, the first groove 14 here is provided so as to extend in a direction orthogonal to an extending direction of the plurality of vapor flow paths 12 such that the extending direction of the plurality of vapor flow paths 12 and the extending direction of the first groove 14 cross with each other.

Incidentally, the reason why such a configuration as described above is applied is such as described below.

Figure 4:
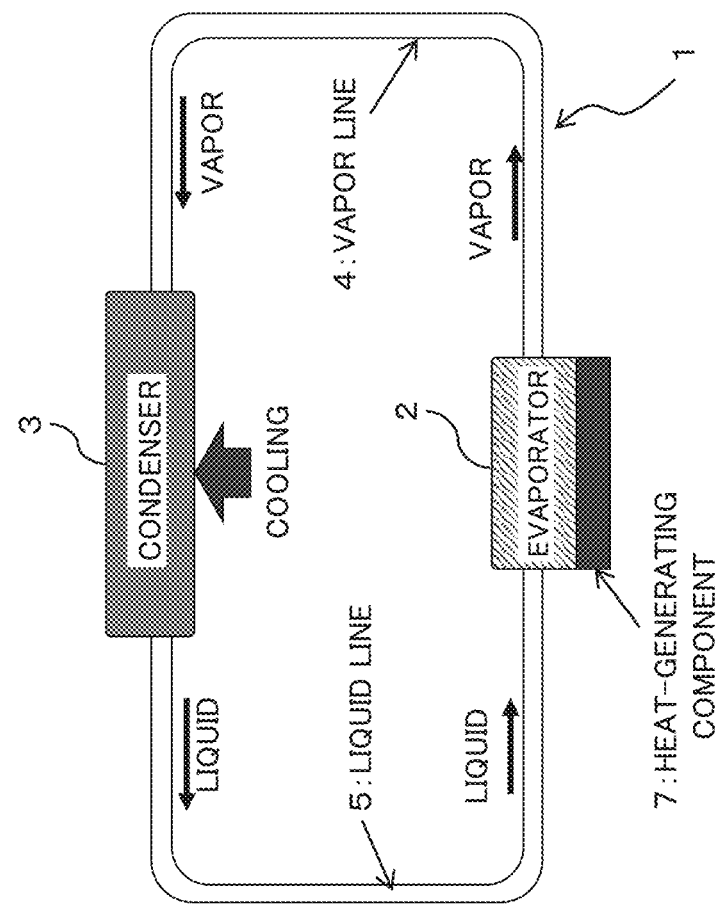
FIG. 4 is a schematic view illustrating a configuration and operation of the loop heat pipe.

As depicted in FIG. 4, the loop heat pipe 1 includes the evaporator 2, condenser 3, and vapor line 4 and liquid line 5 that couple the evaporator 2 and the condenser 3 to each other, and the working fluid is sealed with a constant pressure in the inside thereof.

The working fluid changes from the liquid phase to the vapor phase by heat supplied from the heat-generating component 7, and moves to the condenser 3 through the vapor line 4 together with the heat. The working fluid changes from the vapor phase to the liquid phase by heat radiation in the condenser 3, and returns to the evaporator 2 through the liquid line 5.

A member (not depicted) called wick having fine holes (pores) is accommodated in the inside of the evaporator 2, and capillary force is generated in the pores when the working fluid permeates into the wick and acts as pumping force for the fluid flow.

If the evaporator 2 is heated by heat generated by the heat-generating component 7, then the working fluid of the liquid phase permeated in the wick is evaporated on the surface of the wick thereby to generate the working fluid of the vapor phase. Since the heat generated by the heat-generating component 7 is used for the phase change in the evaporator 2, the heat is deprived of the heat-generating component 7. Then, the working fluid of the vapor phase generated in the evaporator 2 moves to the condenser 3 through the vapor line 4 and then changes into the working fluid of the liquid phase in the condenser 3. By circulation of the working fluid as described above, heat transfer from the heat-generating component 7 is performed successively.

In the loop heat pipe 1, the working fluid of the vapor phase generated in the evaporator 2 passes through the vapor line 4 and reaches the condenser 3. At this time, ideally the working fluid of the liquid phase exists over the flow path from the liquid line 5 side of the condenser 3 to the evaporator 2 and the wick in the evaporator 2 is in a state in which the working liquid permeates therein. Then, since the capillary force in the pores of the wick acts, invasion of the vapor in a direction from the evaporator 2 to the liquid line 5 is suppressed, and then, the capillary force in the wick acts as a check valve for the vapor.

Incidentally, where such a loop heat pipe 1 as described above is applied to the mobile device 6 as depicted in FIG. 2, the loop heat pipe 1 may be configured from the evaporator 2 contacting with the heat-generating component 7 that is a heat source, vapor line 4, condenser 3 including the condensation line 3A and the heat diffusion plate 3B, and liquid line 5 such that, by transporting heat of the heat-generating component 7 contacting with the evaporator 2 to a region having a comparatively low temperature in the mobile device 6, concentration of heat upon the mobile device can be suppressed.

However, where the loop heat pipe 1 is applied to the mobile device 6, it is desired for the components of the loop heat pipe 1 to have a reduced thickness.

For example, if the evaporator 2, vapor line 4, condenser 3 and liquid line 5 that are components of the loop heat pipe 1 are fabricated separately from each other and are coupled to each other by brazing or welding, then it difficult to implement reduction in thickness.

Therefore, it seems recommendable to form a shape of the loop heat pipe by etching process for a plurality of thin metal plates (for example, copper plates) and couple the metal plates by diffusion bonding process to collectively form the evaporator 2, vapor line 4, condenser 3 and liquid line 5 thereby to implement the thin loop heat pipe 1 capable of being accommodated in the mobile device 6.

Figure 5:
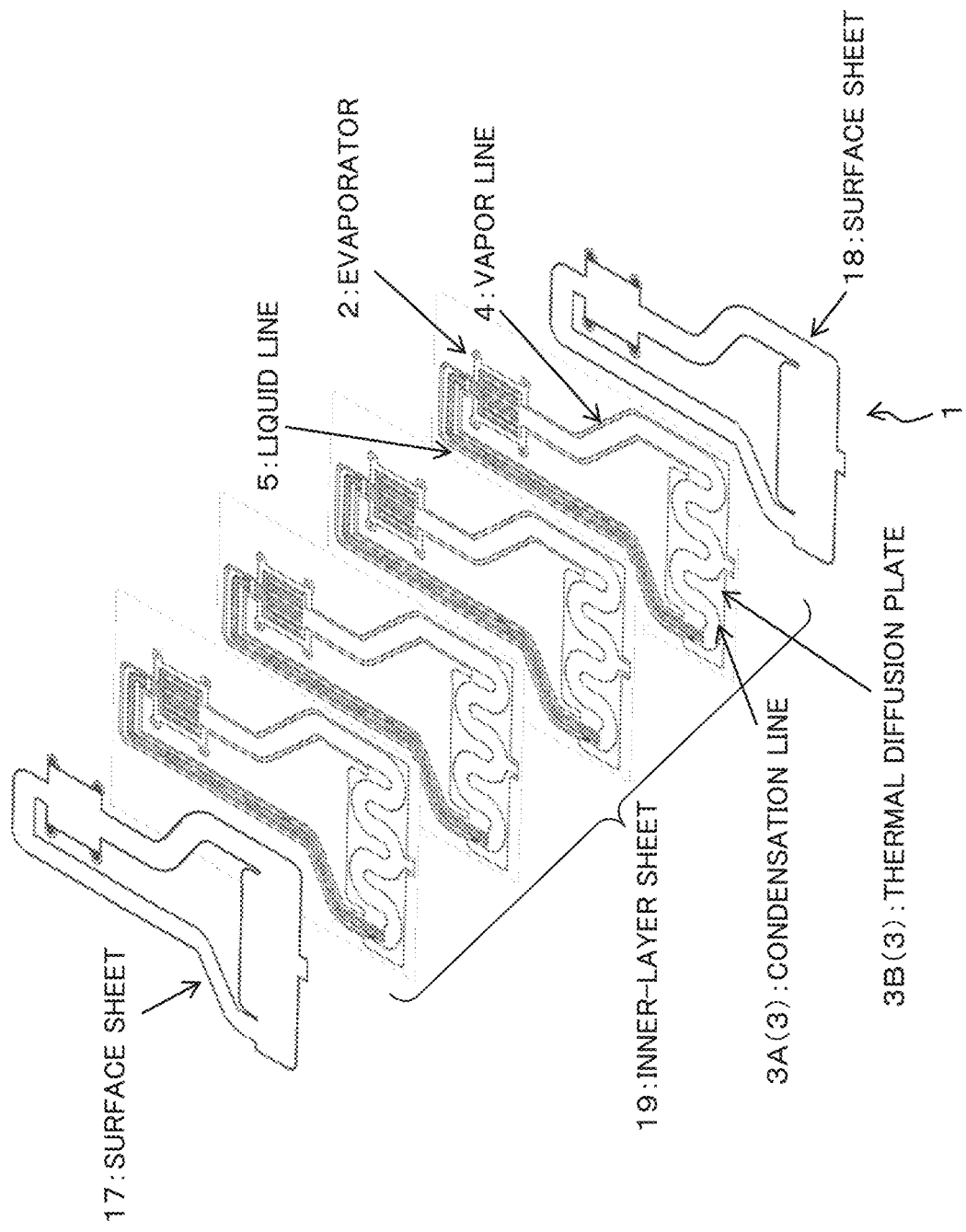
FIG. 5 is a schematic view depicting a configuration of a loop heat pipe that uses six thin metal plates.

For example, as depicted in FIG. 5, the thin loop heat pipe 1 can be configured by stacking six thin metal plates, namely, two surface sheets 17 and 18 and four inner-layer sheets 19 and coupling them by diffusion bonding.

Figure 6:
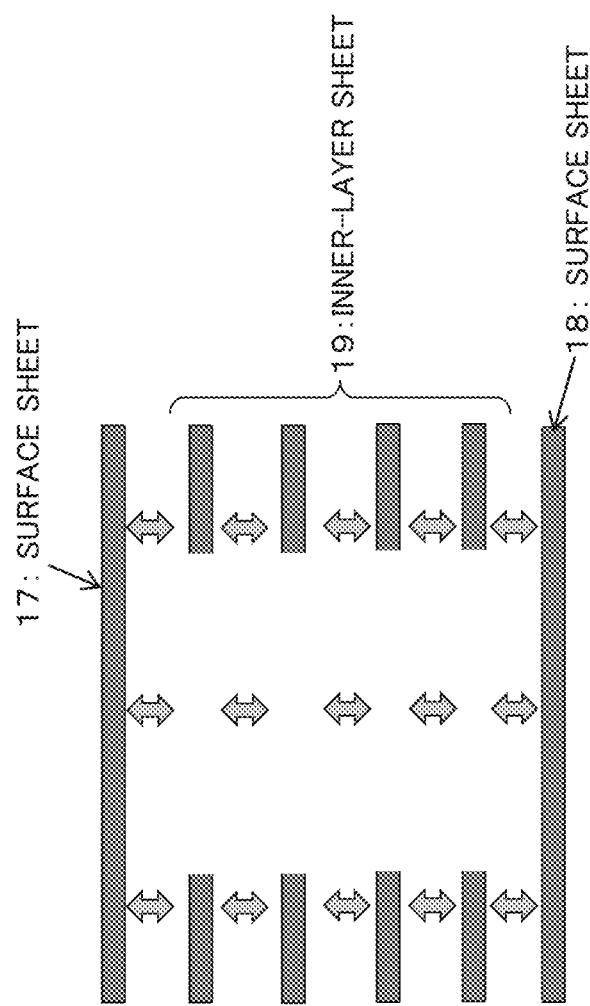
FIG. 6 is a schematic view illustrating a configuration of flow paths of a vapor line and a liquid line provided in the loop heat pipe that uses six thin metal plates and a condensation line provided in the evaporator.

In this case, as depicted in FIG. 6, an opening is provided by etching in the four inner-layer sheets 19 and the four inner-layer sheets 19 having the openings are stacked with the top and the bottom thereof sandwiched by the two surface sheets 17 and 18, respectively. By this, the top and the bottom of the space formed from the openings of the four inner-layer sheets 19 are closed thereby to form the flow path of the vapor line 4, liquid line 5 and the condensation line 3A provided in the condenser 3.

Further, as depicted in FIG. 7, the wick 20 that is a structure that is provided in the inside of the evaporator 2 and generates capillary force for fluid driving is formed by providing a plurality of pores having, for example, a diameter of approximately 0.2 mm in each of the four inner-layer sheets 19 by etching and by displacing the position of the pores provided in each of the inner-layer sheets 19 between the pores in the inner-layer sheets 19 positioned adjacent to each other in an upward and downward direction such that at least part of the pores are overlapped and communicated with each other and fine channels extend three-dimensionally. By providing such a wick 20 as described above, the contact area with the working fluid, namely, the evaporation area, can be increased. It is to be noted that, for details, PCT/JP2013/083504, the entire content of which is incorporated herein by reference, is to be referred to.

Further, the vapor flow paths 12 for evacuating vapor to the vapor line 4 side are provided in the inside of the evaporator 2. Therefore, where the thin loop heat pipe 1 is implemented in such a manner as described above, it seems recommendable to provide the wick 20 provided in the inside of the evaporator 2 by forming as depicted in FIG. 7. In this case, the wick 20 includes a portion (coupling portion) 20A at the side at which the liquid line 5 of the evaporator 2 is coupled thereto and a plurality of branching portions (rib-like portions) 20B branching from the portion 20A. The portion at which the wick 20 in the inside of the evaporator 2 is provided serves as the liquid inlet side portion 10 and the plurality of portions 11, and the portion at which the wick 20 is not provided serves as the plurality of vapor flow paths 12 and the vapor outlet side vapor flow path 13. In this manner, where the thin loop heat pipe 1 is implemented in such a manner as described above, in the inside of the evaporator 2, it seems recommendable to alternately arrange the plurality of comb tooth-shaped portions of the wick 20 as the plurality of portions 11 extending along a direction in which the working fluid flows and the vapor flow paths 12 as the vapor flow path extending along the direction in which the working fluid flows along a direction orthogonal to a direction in which the working fluid flows in the same plane. For example, by configuring the four inner-layer sheets 19 so as to have a portion having a plurality of pores that serve as the liquid inlet side portion 10 and the plurality of portions 11 and openings that function as the vapor flow paths 12 and 13 and stacking and diffusion boding them, the evaporator 2 having the wick 20 and the vapor flow paths 12 and 13 can be formed.

Figure 8:
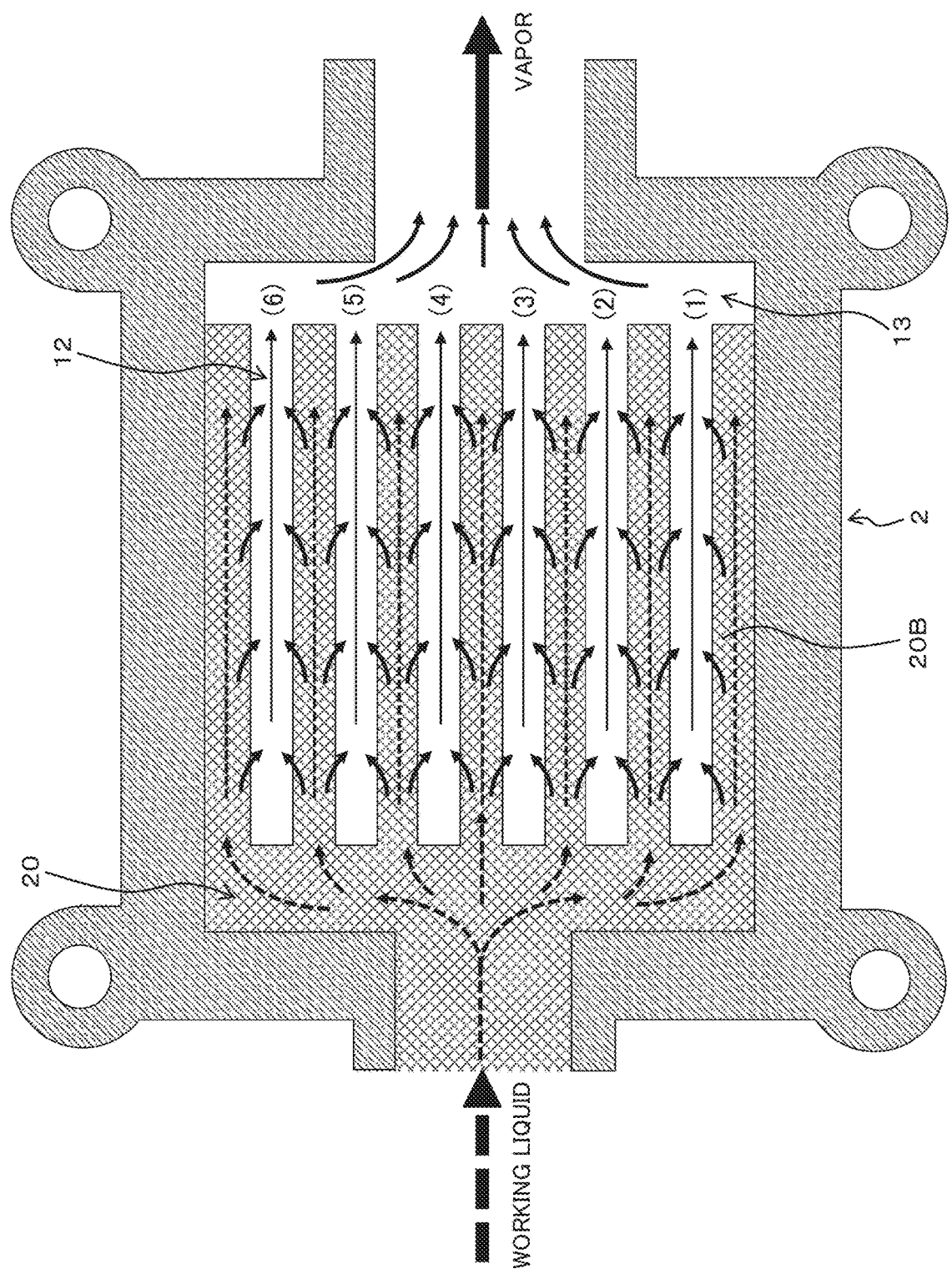
FIG. 8 is a schematic view illustrating movement of working fluid in the inside of the evaporator provided in the loop heat pipe that uses six thin metal plates.

In this case, as depicted in FIG. 8, if the working liquid flowing from the liquid line 5 side into the evaporator 2 permeates into the inside of the wick 20 and is evaporated into vapor by heat from the heat source, then the vapor is evacuated to the vapor line 4 through the vapor flow paths 12 and 13 provided between the plurality of portions 11 of the wick 20. It is to be noted that FIG. 8 exemplifies flow of the working fluid in the evaporator 2 that includes the wick 20 that in turn includes seven branching portions (comb tooth-like portions) 20B and six vapor flow paths 12 (in FIG. 8, refer to reference characters (1) to (6)) are provided between the branching portions 20B. Further, in FIG. 8, a flow of the working liquid is indicated by a broken line and a flow of vapor is indicated by a solid line.

Figure 9B:
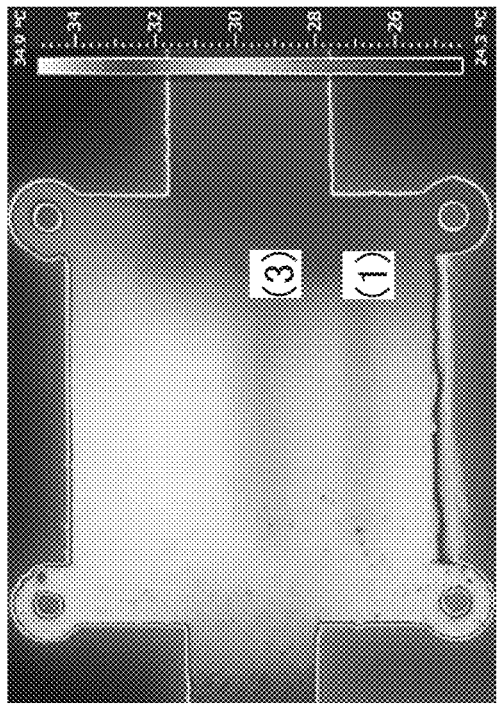
FIGS. 9A to 9C are views depicting infrared thermography images when heat is inputted to the evaporator provided in the loop heat pipe that uses six thin metal plates.
Figure 9C:
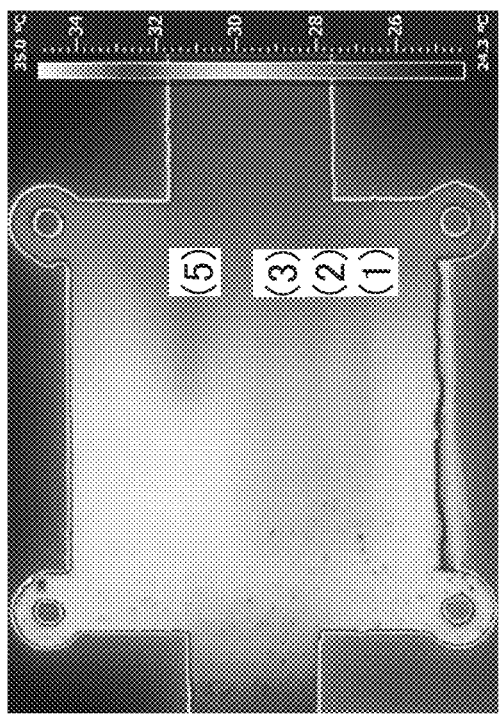
Figure 9A:
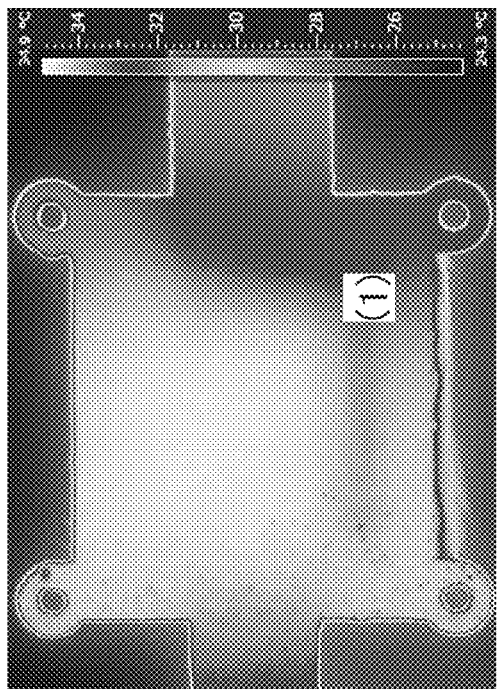

Here, FIGS. 9A to 9C depict infrared thermography images when heat is applied to the evaporator 2. It is to be noted that, in FIGS. 9A and 9C, a light color region and a dark color region indicate that the temperature is high and low, respectively. In actual infrared thermography images, a light color region is a white region and a dark color region is a red region. A behavior of the working fluid in the inside of the evaporator 2 can be inferred from a temperature distribution in the infrared thermography images.

Here, since a heat source is disposed at a lower portion of the evaporator 2 and the entire evaporator is warmed by heat conduction of a thin metal plate (here, a copper plate) configuring the evaporator 2 just after applying the hear, from the heat source to the evaporator 2, the evaporator 2 is displayed in a light color (white).

Then, if the working liquid in the evaporator 2 begins to be evaporated, then, as depicted in FIG. 9A, the vapor first flows toward the vapor line 4 in the vapor flow path 12 denoted by reference character (1) in FIG. 9A. Since the heat is deprived at this time, the region of the vapor flow path 12 denoted by reference character (1) in FIG. 9A is placed into a lower temperature state than that of the surroundings, and the vapor flow path 12 is displayed in a dark color (red).

Then, as depicted in FIG. 9B, the vapor is evacuated from the vapor flow path 12 denoted by reference character (3) in FIG. 9B to the vapor line 4, and portions of the vapor flow path 12 denoted by reference characters (1) and (3) in FIG. 9B are placed into a lower temperature than that of the surroundings and the vapor flow path 12 is displayed in a dark color (red).

Then, as depicted in FIG. 9C, the vapor is evacuated from the vapor flow path 12 denoted by reference character (2) in FIG. 9C, and regions of the vapor flow path 12 denoted by reference characters (1), (3) and (2) in FIG. 9C are placed into a lower temperature state than that of the surroundings and the vapor flow path 12 is displayed in a dark color (red). Thereafter, the vapor is evacuated from the vapor flow path 12 denoted by reference character (5) in FIG. 9C, and regions of the vapor flow path 12 denoted by reference characters (1), (3), (2) and (5) in FIG. 9C are placed into a lower temperature state than that of the surroundings and the vapor flow path 12 is displayed in a dark color (red).

In this manner, if the wick provided in the inside of the evaporator 2 is provided in a patterned state as depicted in FIG. 7 in order to implement the thin loop heat pipe 1 as described above, then discharge of vapor is performed after time lags in order from the vapor flow path 12 denoted by reference character (1) in FIG. 8, vapor flow path 12 denoted by reference character (3) in FIG. 8, vapor flow path 12 denoted by reference character (2) in FIG. 8, vapor flow path 12 denoted by reference character (5) in FIG. 8, vapor flow path 12 denoted by reference character (4) in FIG. 8 and vapor flow path 12 denoted by reference character (6) in FIG. 8.

It is considered that the order in vapor evacuation arises from a variation in temperature and pressure in the vapor flow path 12 upon evaporation of the working liquid in the evaporator 2.

Incidentally, when the working liquid in the evaporator 2 is evaporated by heat from the heat source and the vapor passes through the vapor line 4 and then advances to the condenser 3, a temperature rise at the components of the loop heat pipe 1 is observed.

Thus, a period of time after the heat is applied to the evaporator 2 until the temperature at the inlet of the condenser 3 rises, namely, the period of time after the heat is applied to the evaporator 2 until, after the temperature of the evaporator 2 rises, the heat is transported and the temperature drops, can be considered the start-up time period of the loop heat pipe 1.

Figure 10:
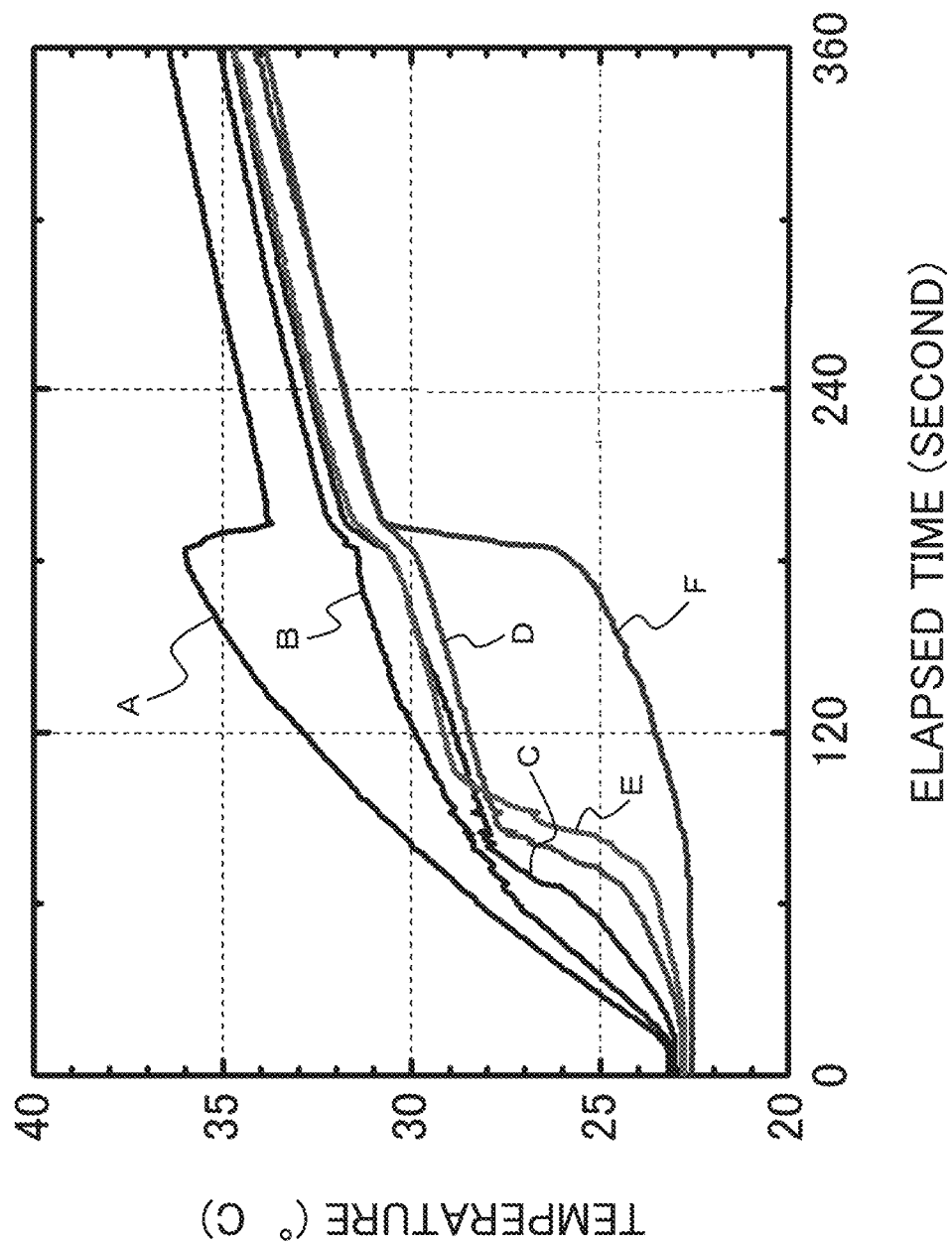
FIG. 10 is a view depicting temperature profiles of different portions of the loop heat pipe when the loop heat pipe that uses six thin metal plates is started.

Here, FIG. 10 depicts a temperature profile of the components of the loop heat pipe 1 when the loop heat pipe 1 is activated.

Figure 11:
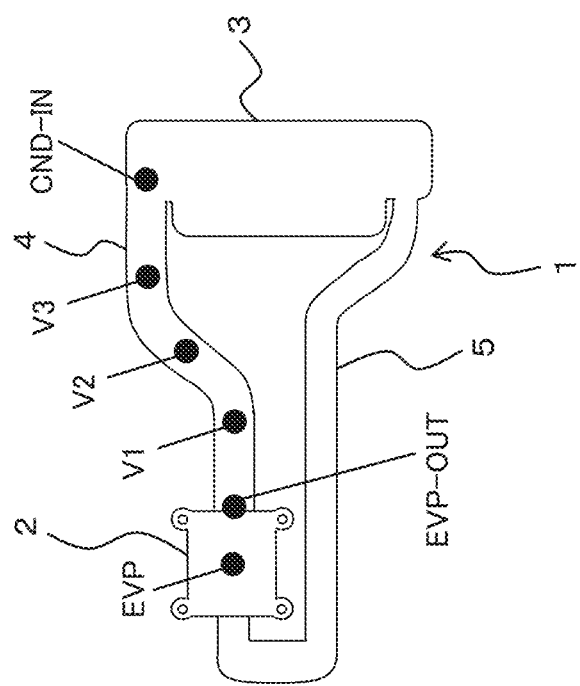
FIG. 11 is a view depicting temperature measurement portions of the loop heat pipe when a temperature profile at each portion upon starting of the loop heat pipe that uses six thin metal plates is measured.

In FIG. 10, a solid line A indicates a result when the temperature at a location denoted by EVP in FIG. 11, namely, the temperature EVP of the evaporator 2 of the loop heat pipe 1, is measured. Further, in FIG. 10, a solid line B indicates a result when the temperature at a location indicated by EVP-OUT in FIG. 11, namely, the temperature EVP-OUT at the outlet of the evaporator 2, is measured. Further, in FIG. 10, a solid line C indicates a result when the temperature at a location indicated by V1 in FIG. 11, namely, the temperature V1 at the evaporator 2 side of the vapor line 4, is measured. Further, in FIG. 10, a solid line D indicates a result when the temperature at a location indicated by V2 in FIG. 11, namely, the temperature V2 at an intermediate portion of the vapor line 4, is measured. Further, in FIG. 10, a solid line E indicates a result when the temperature at a location indicated by V3 in FIG. 11, namely, the temperature V3 at the condenser 3 side of the vapor line 4, is measured. Further, in FIG. 10, a solid line F indicates a result when the temperature at a location indicated by CND-IN in FIG. 11, namely, the temperature CND-IN of the inlet of the condenser 3, is measured.

It has been found that, if the wick 20 provided in the inside of the evaporator 2 is patterned and provided as depicted in FIG. 7 in order to implement the thin loop heat pipe 1 in such a manner as described above, then since a distribution appears in the temperature and the pressure in the evaporator 2 and discharge of the vapor becomes non-uniform, the start-up time period of the loop heat pipe 1 becomes approximately 190 seconds as depicted in FIG. 10 and a long period of time is required for start-up of the loop heat pipe 1 (namely, for heat, transfer from the evaporator 2 to the condenser 3).

Thus, in order to reduce the start-up time period to start heat transfer as quickly as possible in the loop heat pipe 1 in which the evaporator 2 has a reduced thickness, the evaporator 2 is configured such that, as described hereinabove, the plurality of portions 11 individually include the first groove 14 for communicating two vapor flow paths 12 adjacent to each other from among the plurality of vapor flow paths 12 as depicted in FIG. 1.

Since the vapor flow paths 12 adjacent to each other are communicated with each other by the first groove 14 in this manner, the pressure difference between the vapor flow paths 12 disappears and the pressure distribution in the evaporator 2 upon vapor generation disappears, and the working fluid of the vapor phase generated by heat from the heat source is evacuated uniformly to the vapor line 4. Consequently, the start-up time period of the loop heat pipe 1 can be reduced.

In this case, in the inside of the evaporator 2, in the evaporator 2 provided in the thin loop heat pipe 1 described above in which the wick 20 patterned as depicted in FIG. 7 is provided, the plurality of portions 11 individually include the first groove 14 for communicating vapor flow paths 12 adjacent to each other from among the plurality of vapor flow paths 12 as depicted in FIG. 1.

In particular, where the six thin metal plates, namely, the two surface sheets 17 and 18 and the four inner-layer sheet 19, are stacked and diffusion bonded to configure the thin loop heat pipe 1 as described hereinabove (refer to FIGS. 5 to 7), as the first groove 14, a plurality of grooves extending in the widthwise direction may be provided in a parallel and juxtaposed relationship in the lengthwise direction to each other in the region, in which the plurality of portions 11 of the evaporator 2 of at least one of the two surface sheets 17 and 18 are to be formed, so as to have a depth smaller than the plate thickness by processing such as, for example, half etching, and further, the first wide groove 15 may be provided in the region, in which the plurality of vapor flow paths 12 and the vapor outlet side vapor flow path 13 are to be formed. It is to be noted that the number of thin metal plates, the number of first grooves 14 or first wide grooves 15, the distance or the shape are not limited to those exemplified here.

In this case, the evaporator 2 is structured such that the first plate-like member 16 (here, one of the two surface sheets 17 and 18) having the first groove 14 and the first wide width 15 that has a width greater than that of the first groove 14 and is to serve as part of the plurality of vapor flow paths 12 and the vapor outlet side vapor flow path 13 and the plurality of third plate-like members (here, four inner-layer sheets 19) having a portion having a plurality of pores and an opening to serve as part of the plurality of vapor flow paths 12 and the vapor outlet side vapor flow path 13 are joined together. The plurality of portions 11 and the liquid inlet side portion 10 include the wick 20 (refer to FIG. 7) configured by stacking the portion having the plurality of pores such that at least the part of the pores overlap and are communicated with each other. It is to be noted here that the plurality of third plate-like members are metal plates (thin metal plates), and particularly are copper plates (thin copper plate).

Figure 12:
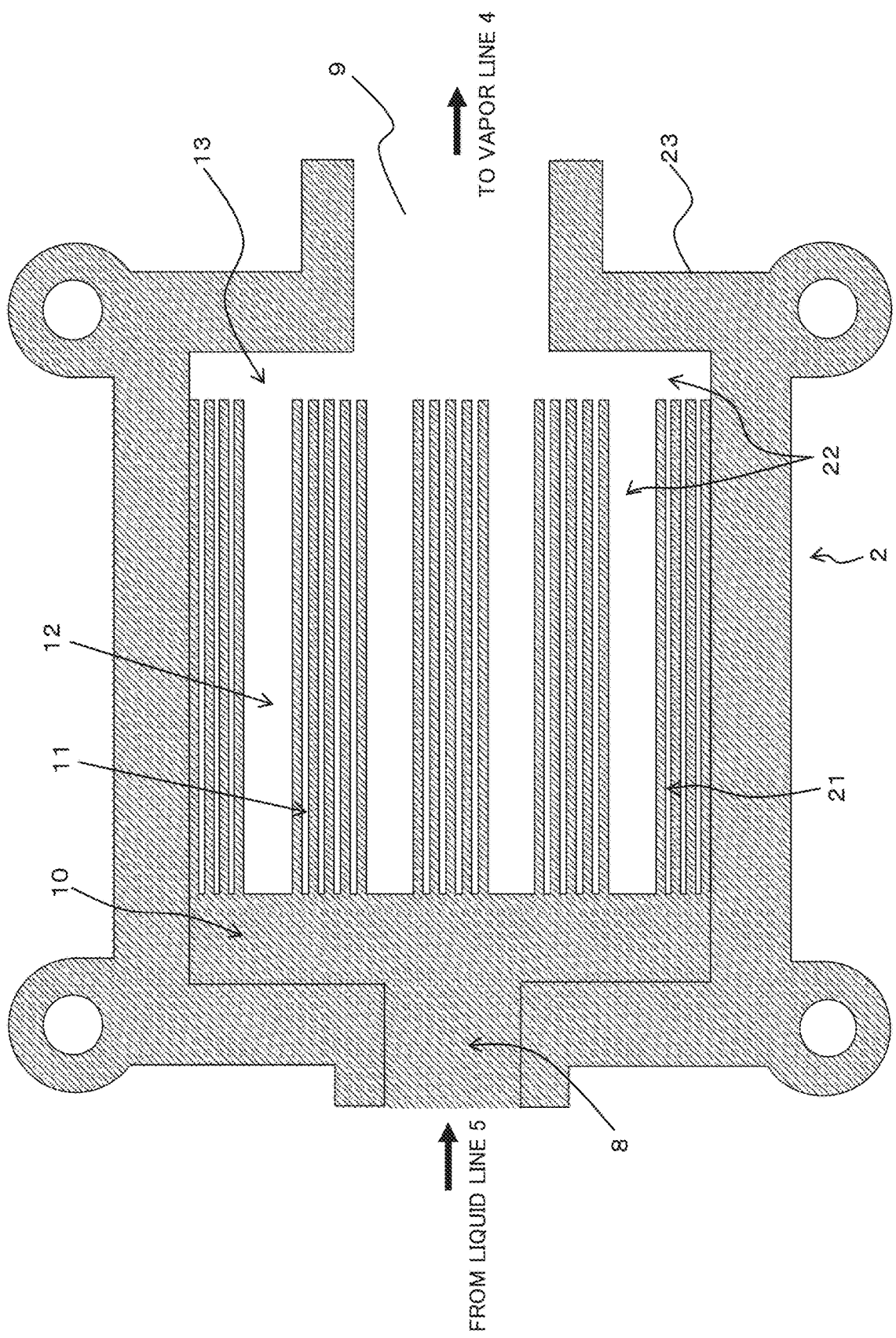
FIG. 12 is a schematic view depicting an example of a configuration of the evaporator provided in the loop heat pipe according to the embodiment.

Incidentally, where the plurality of portions 11 include the first groove 14 as described above, the first groove 14 may be configured as a groove capable or generating capillary force. In this case, as depicted in FIG. 12, it is preferable to configure each of the plurality of portions 11 so as to have a second groove 21 extending in the length direction and configure the second groove 21 also as a groove capable of generating capillary force. By providing such a second groove 21 as just described, it is possible to allow the working fluid of the liquid phase to flow toward the lengthwise direction. In particular, if the first groove 14 described above and capable of generating capillary force is provided, then the working fluid of the liquid phase becomes likely to spread toward the widthwise direction but becomes less likely to flow toward the lengthwise direction. Therefore, by providing the second groove 21 capable of generating capillary force, the working fluid of the liquid phase is permitted to be likely to flow toward the lengthwise direction.

In this case, the evaporator 2 may be configured such that it includes not only the first plate-like member 16 described hereinabove (refer to FIG. 1; one of the surface sheets 17 and 18 of FIG. 5) and she third plate-like members (four inner-layer sheets 19 of FIG. 5) but also a second plate-like member 23 having the second groove 21 and a second wide groove 22 that has a width greater than that of the second groove 21 and is to serve as part of the plurality of vapor flow paths 12 and the vapor outlet side vapor flow path 13, and the first groove 14 and the second groove 21 are configured individually as grooves capable of generating capillary force. Here, the second plate-like member 23 is a metal plate (thin metal plate) and particularly is a copper plate (thin copper plate). Further, the second plate-like member 23 includes the second groove 21 and the second wide groove 22 provided so as to have a depth smaller than the plate thickness by processing such as, for example, half etching. Here, as the second groove 21, a plurality of groove extending in the length direction are provided in a parallel and juxtaposed relationship to each other in the widthwise direction. Further, the first groove 14 and the second groove 21 are provided so as to be orthogonal to each other. It is to be noted that the number, the distance and the shape of the second grooves 21 and second wide grooves 22 are not limited to those exemplified here.

In particular, where the six thin metal plates, namely, the two surface sheets 17 and 18 and the four inner-layer sheets 19, are stacked and diffusion bonded to configure the thin loop heat pipe 1 as described hereinabove (refer to FIGS. 5 to 7), such a configuration as described below may be applied. In particular, as depicted in FIG. 1, as the first groove 14, a plurality of grooves extending in the widthwise direction and capable of generating capillary force are provided in a parallel and juxtaposed relationship with each other in the lengthwise direction in a region, in which the plurality of portions 11 of the evaporator 2 are to be formed, of one of the two surface sheets 17 and 18 (here, the first plate-like member 16) so as to have a depth smaller than the plate thickness by processing such as, for example, half etching and the first wide groove 15 is further provided in a region in which the plurality of vapor flow paths 12 and the vapor outlet side vapor flow path 13 are to be formed. Further, as depicted in FIG. 12, as the second groove 21, a plurality of grooves extending in the lengthwise direction and capable of generating capillary force are provided in a parallel and juxtaposed relationship with each other in the widthwise direction in the region, in which the plurality of portions 11 of the evaporator 2 are to be formed, of the other one of the two surface sheets 17 and 18 (here, the second plate-like member 23) so as to have a depth smaller than the plate thickness by processing such as, for example, half etching and the second wide groove 22 is provided in the region in which the plurality of vapor flow paths 12 and the vapor outlet side vapor flow path 13 are to be formed.

Incidentally, while the liquid inlet side portion 10 and the plurality of portions 11 of the evaporator 2 here are configured including the wick 20 (refer to FIG. 7) configured in such a manner as described above, the configuration not limited to this, and the liquid inlet side portion 10 and the plurality of portions 11 of the evaporator 2 may be any portions if they serve as portions at which capillary force is generated and working fluid of the liquid phase permeates and changes into working fluid of the vapor phase. For example, the liquid inlet side portion 10 and the plurality of portions 11 of the evaporator 2 may be configured as portions that do not include the wick 20 configured in such a manner as described above.

Figure 13:
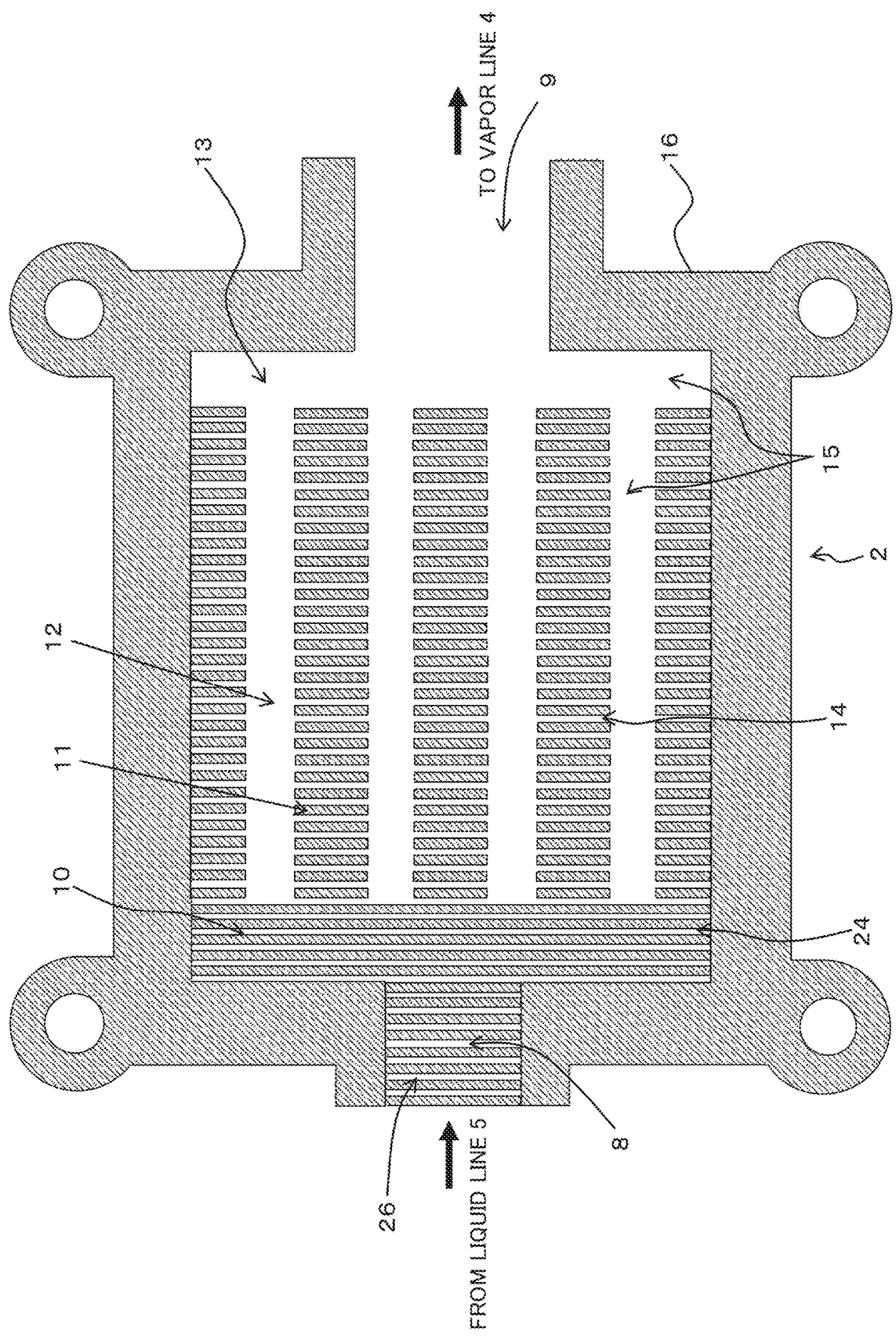
FIG. 13 is a schematic view depicting an example of a configuration of the evaporator provided in the loop heat pipe according to the embodiment.
Figure 14:
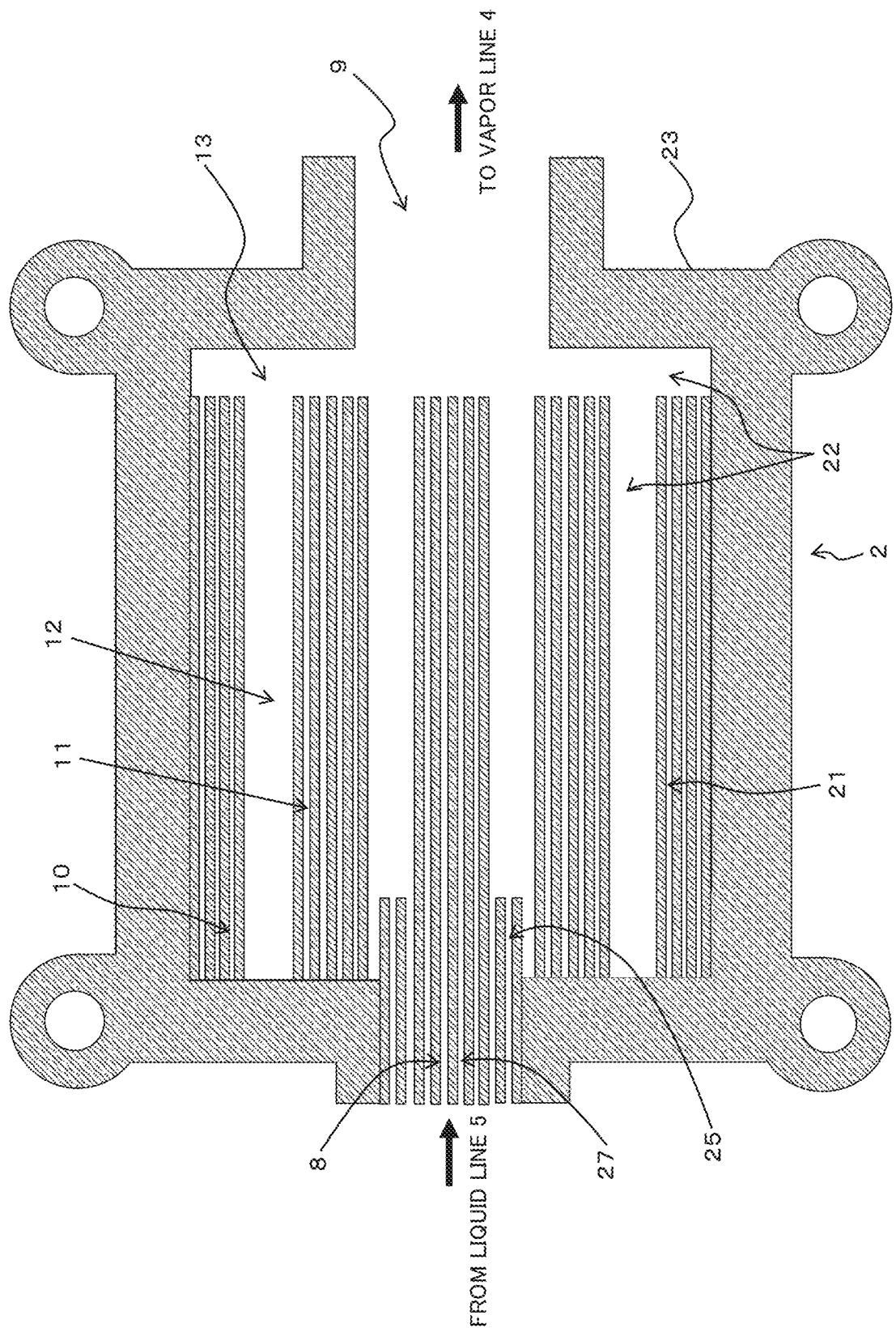
FIG. 14 is a schematic view depicting an example of a configuration of the evaporator provided in the loop heat pipe according to the embodiment.

In this case, as depicted in FIGS. 13 and 14, each of the plurality of portions 11 of the evaporator 2 may be configured including the first groove 14 for communicating two vapor flow paths 12 adjacent to each other from among the plurality of vapor flow paths 12 and the second groove 21 extending in the lengthwise direction, and the liquid inlet side portion 10 of the evaporator 2 may be configured including the third groove 24 extending in the widthwise direction and the fourth groove 25 provided in a region continuing to the liquid inlet 8 and a region which each of the plurality of portions 11 continues and extending in the lengthwise direction. Further, the first groove 14, second groove 21, third groove 24 and fourth groove 25 may be configured as grooves capable of generating capillary force. It is to be noted that the number, distance and shape of the third groove 24 and the fourth groove 25 are not limited to those exemplified here.

In this case, not only the first groove 14 and the first wide groove 15 but also the third groove 24 may be provided on the first plate-like member 16 described hereinabove as depicted in FIG. 13. In particular, the first plate-like member 16 described above may be configured including the first groove 14, first wide groove 15 and third groove 24 provided so as to have a depth smaller than the plate thickness by processing such as, for example, half etching. Here, as the third groove 24, a plurality of grooves extending in the widthwise direction are provided in a parallel and juxtaposed relationship with each other in the lengthwise direction. Further, the first groove 14 and third groove 24 and the portion extending in the lengthwise direction of the first wide groove 15 (portion in which part of the plurality of vapor flow paths 12 are to be formed) are provided on the first plate-like member 16 here such that the directions in which they extend are orthogonal to each other. Further, the first groove and third groove 24 and the portion extending in the widthwise direction of the first wide groove 15 (portion that is to become part of the vapor outlet side vapor flow path 13) are provided on the first plate-like member 16 here such that the directions in which they extend become parallel to each other.

Or, not only the second groove 21 and second wide groove 22 but also the fourth groove 25 may be provided on the second plate-like member 23 described hereinabove as depicted in FIG. 14. In particular, the second plate-like member 23 described above may be configured including the second groove 21, second wide groove 22 and fourth groove 25 provided so as to have a depth smaller than the plate thickness by processing such as, for example, half etching. Here, as the fourth groove 25, a plurality of grooves extending in the lengthwise direction are provided in a parallel and juxtaposed relationship to each other in the widthwise direction in the region continuing to the liquid inlet 8 and the region in which each of the plurality of portions 11 continues. Further, the second groove 21 and fourth groove 25 and the portion extending in the lengthwise direction of the second wide groove 22 (portion to become part of the plurality of vapor flow paths 12) are provided on the second plate-like member 23 here such that the directions in which they extend are parallel to each other. In particular, on the second plate-like member 23 here, the plurality of second grooves 21 and fourth grooves 25 and the portion extending in the lengthwise direction of the second wide groove 22 (portion that is to become part of the plurality of vapor flow paths 12) are provided alternately along the widthwise direction. Further, on the second plate-like member 23 here, the second groove 21 and fourth groove 25 and the portion extending in the widthwise direction of the second wide groove 22 (portion that is to become part of the vapor outlet side vapor flow path 13) are provided such that the directions in which they extend are orthogonal to each other.

It is to be noted here that, since the first groove 14, second groove 21, third groove 24 and fourth groove 25 are fine pitch grooves individually having a size with which capillary force can be generated, the grooves are hereinafter referred to also as fine pitch grooves. On the other hand, the first wide groove 15 and the second wide groove 22 may be grooves individually having a size capable of configuring a flow path in which working fluid of the vapor phase flows and is evacuated to the vapor line 4, and are hereinafter referred to also as grooves.

Figure 15:
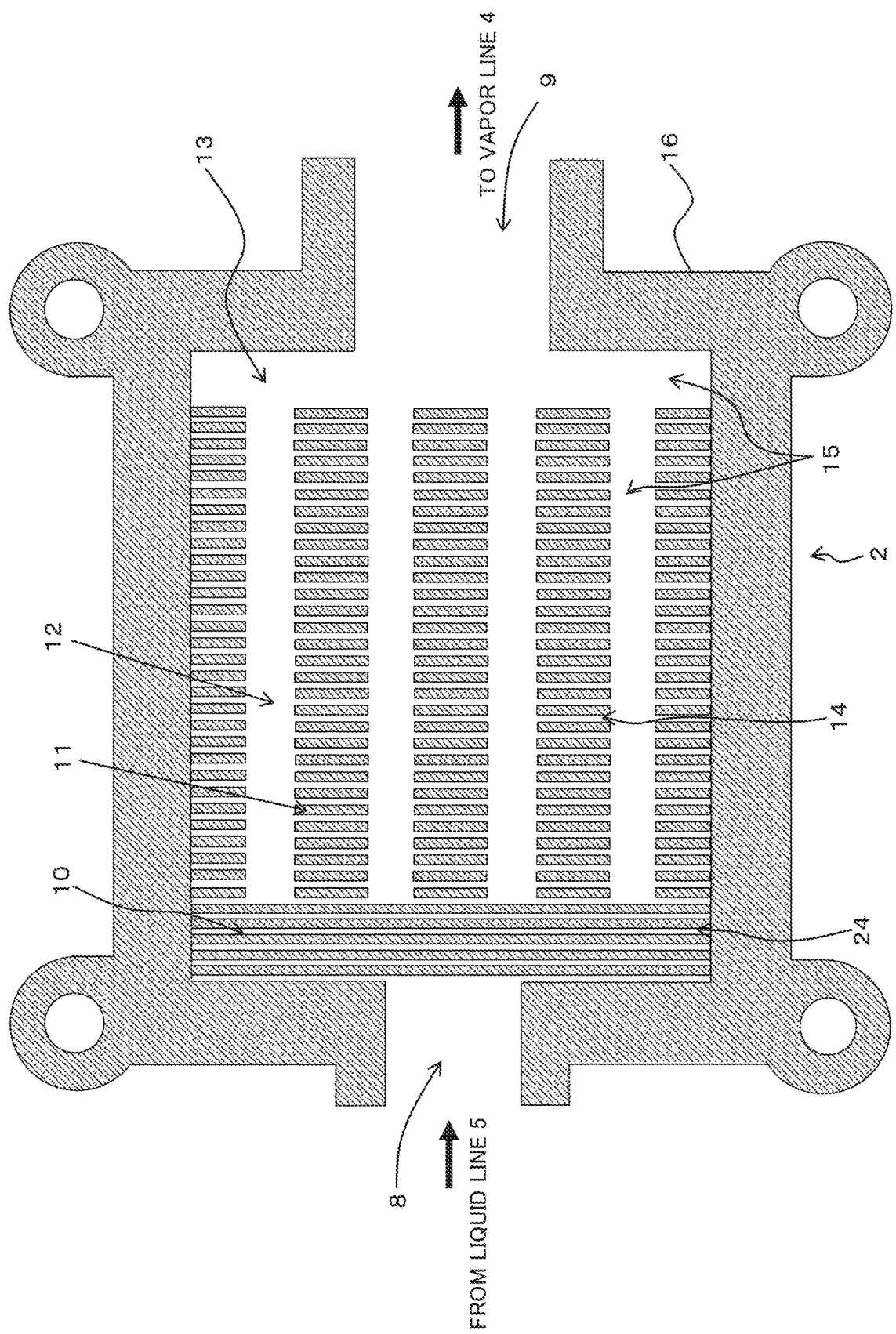
FIG. 15 is a schematic view depicting an example of a configuration of the evaporator provided in the loop heat pipe according to the embodiment.
Figure 16:
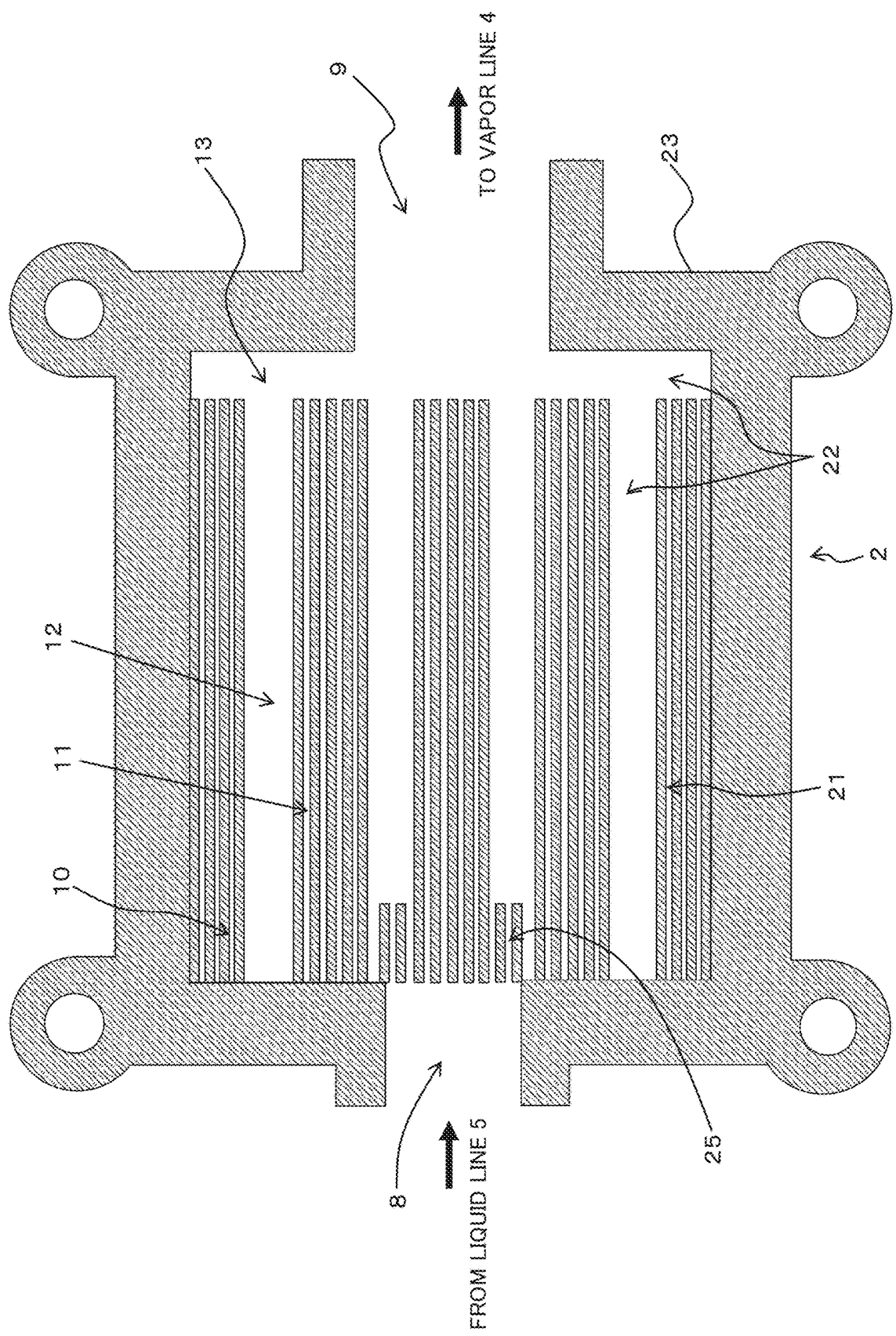
FIG. 16 is a schematic view depicting an example of a configuration of the evaporator provided in the loop heat pipe according to the embodiment.
Figure 17:
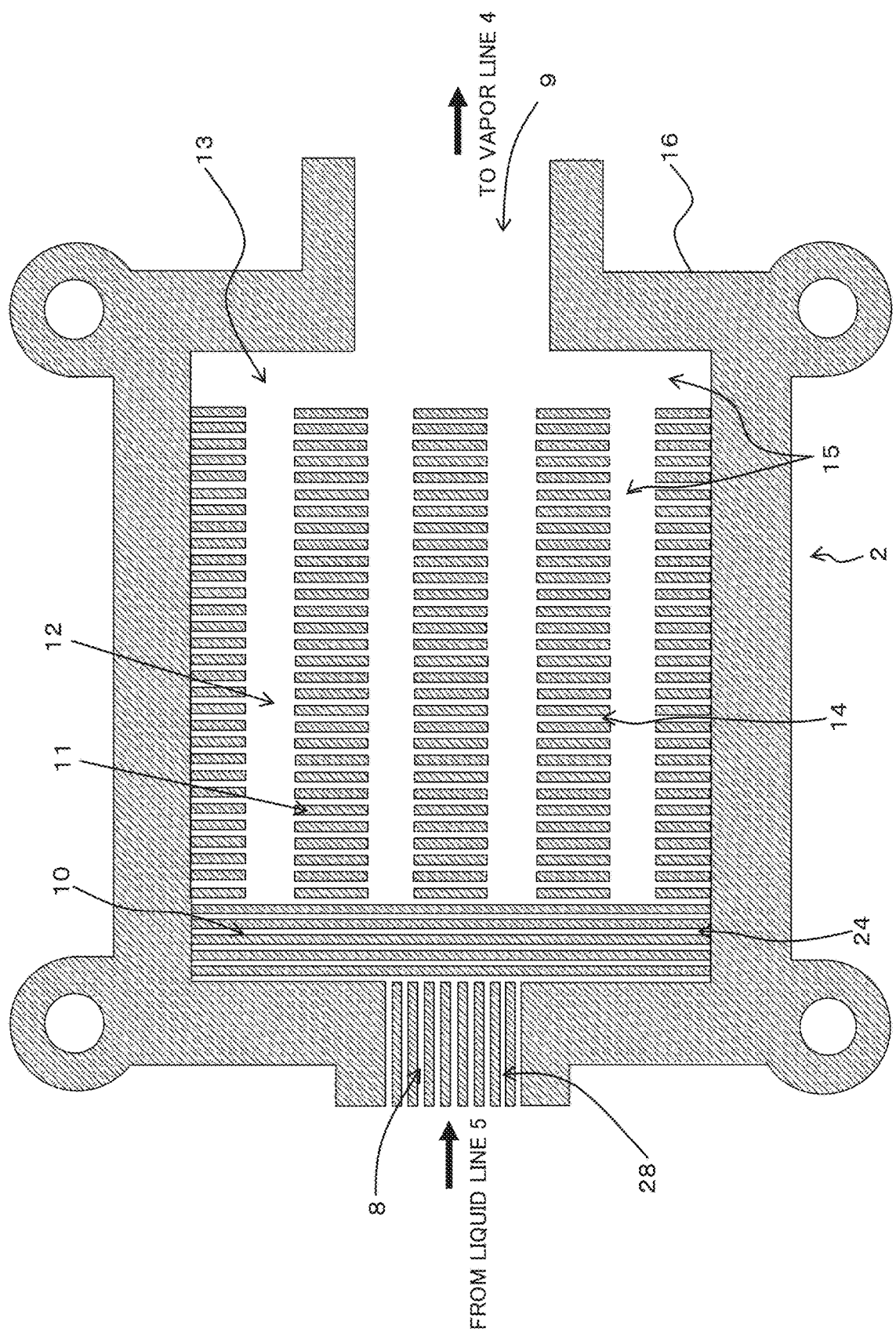
FIG. 17 is a schematic view depicting an example of a configuration of the evaporator provided in the loop heat pipe according to the embodiment.

Further, while grooves 26 and 27 are provided in a region, in which the inlet of the evaporator 2, namely, the liquid inlet 8, is to be provided, of the first plate-like member 16 and second plate-like member 23 here as depicted in FIGS. 13 and 14, the grooves may not be provided, for example, as depicted in FIGS. 15 and 16. Further, while the plurality of grooves 26 extending in the widthwise direction are provided in a region, in which the inlet of the evaporator 2, namely, the liquid inlet 8, is to be formed, of the first plate-like member 16 here as depicted in FIG. 13, the configuration is not limited to this, and a plurality of grooves 28 extending in the lengthwise direction may be provided, for example, as depicted in FIG. 17.

Further, the evaporator 2 may be structured such that the first plate-like member 16 including the first groove 14, third groove 24 and first wide groove 15 that has a width greater than that of the first and third grooves 14 and 24 and is to form part of the plurality of vapor flow paths 12 and the vapor outlet side vapor flow path 13 and the second plate-like member 23 including the second groove 21, fourth groove 25 and second wide groove 22 that has a width greater than that of the second groove 21 and fourth groove 25 and is to form part of the plurality of vapor flow paths 12 and the vapor outlet side vapor flow path 13 are coupled to each other such that the side having the first groove 14, third groove 24 and first wide groove 15 and the side having the second groove 21, fourth groove 25 and second wide groove 22 are opposed to each other. By configuring the evaporator 2 from the two plate-like members of the first plate-like member 16 and the second plate-like member 23 in this manner, the cost can be reduced. In short, reduction in thickness, reduction of the start-up time period and reduction of the cost of the loop heat pipe 1 can be implemented.

In this case, in the plurality of portions 11 of the evaporator 2, the first groove 14 capable of generating capillary force and the second groove 21 capable of generating capillary force are provided so as to cross (here, orthogonally) with each other and are communicated with each other to configure a fine channel. Further, in the liquid inlet side portion 10 of the evaporator 2, the third groove 24 capable of generating capillary force and the fourth groove 25 capable of generating capillary force axe provided so as to cross (here, orthogonally) with each other and are communicated with each other to configure a fine channel.

Consequently, in the liquid inlet side portion 10 and the plurality of portions 11 of the evaporator 2, the grooves 14, 24, 21 and 25 provided at the portions function similarly to a wick provided in the inside of an evaporator of a general loop heat pipe so as to generate capillary force such that working fluid of the liquid phase permeates and is changed into working fluid of the vapor phase.

Especially, the second groove 21 and the fourth groove 25 extend in the lengthwise direction of the evaporator 2, namely, in the direction in which working fluid of the liquid phase flows. Therefore, if working fluid of the liquid phase flowing into the evaporator 2 from the liquid line 5 flows into the second groove 21 and the fourth groove 25, then capillary force is generated and, by the capillary force, the working fluid flows toward the side to which the vapor line 4 is coupled along the lengthwise direction of the evaporator 2. Further, the first groove 14 and the third groove 24 extend along the widthwise direction of the evaporator 2. Therefore, if the working fluid of the liquid phase flowing into the evaporator 2 from the liquid line 5 flows into the first groove 14 and the third groove 24, then capillary force is generated and, by the capillary force, pumping force is generated in the widthwise direction of the evaporator 2 and causes the working fluid to flow along the widthwise direction of the evaporator 2. In this manner, the working fluid of the liquid phase is caused to flow so as to spread in a planar direction by the first groove 14, second groove 21, third groove 24 and fourth groove 25. Further, since the two vapor flow paths 12 adjacent to each other from among the plurality of vapor flow paths 12 are communicated with each other by the first groove 14, the pressure difference between the plurality of vapor flow paths 12 disappears and the working fluid of the vapor phase is evacuated uniformly, and the start-up time period of the loop heat pipe 1 can be reduced.

Further, the plurality of vapor flow paths 12 of the evaporator 2 are configured from the portion of the first wide groove 15 extending in the lengthwise direction and the portion of the second wide groove 22 extending in the lengthwise direction. Further, the vapor outlet side vapor flow path 13 of the evaporator 2 is configured from the portion of the first wide groove 15 extending in the widthwise direction and the portion of the second wide groove 22 extending in the widthwise direction.

In particular, the thin loop heat pipe 1 may be configured in the following manner. The first groove 14, first wide groove 15 and third groove 24 are provided in a region, which is to serve as the evaporator 2, of at least one of the two thin metal plates (the two surface sheets) as the first plate-like member 16 and the second plate-like member 23 so as to have a depth smaller than the plate thickness by processing such as, for example, half etching. Further, the second groove 21, second wide width 22 and fourth groove 25 are provided in a region, which is to serve as the evaporator 2, of the other one of the two thin metal plates so as to have a depth smaller than the plate thickness by processing such as, for example, half etching. Further, concave portions for configuring the flow paths of the vapor line 4, condensation line 3A provided in the condenser 3 and liquid line 5 are provided in a region, which is to serve as the vapor line 4, a region, which is to serve as the condensation line 3A provided in the condenser 3, and a region, which is to serve as the liquid line 5, of the two thin metal plates. Then, the two thin metal plates are opposed to each other such that the faces thereof on which the grooves and concave portions are provided contact with each other, and are joined together by diffusion bonding.

In this case, by coupling the two plate-like members of the first plate-like member 16 and the second plate-like member 23, the evaporator 2, vapor line 4, condenser 3 and liquid line 5 are integrally formed. In particular, the evaporator 2, vapor line 4, condenser 3 and liquid line 5 are configured from a same material (here, copper).

Here, the concave portions provided in the regions, which are to serve as the condensation line 3A, of the first plate-like member 16 and the second plate-like member 23 are provided in a meandering pattern such that the efficiency in heat exchange with the outside air is raised and liquefaction by condensation can be performed sufficiently. Further, upon patterning into the shape of the evaporator 2, vapor line 4, condenser 3 and liquid line 5, by leaving the plate-like member in the form of a plate around the region, in which the condensation line 3A provided in the condenser 3 is to be formed, the portion functions as the heat diffusion plate 3B provided in the condenser 3.

The loop heat pipe 1 configured from the two plate-like members of the first plate-like member 16 and second plate-like member 23 as described above can be fabricated in the following manner.

First, a region of the first plate-like member 16, in which the evaporator 2 is to be formed, is half etched to form, in a region in which the plurality of portions 11 extending in the lengthwise direction from the side of the liquid inlet 8 toward the side of the vapor outlet 9 of the region serving as the evaporator 2 are to be formed, a first groove 14 extending in the widthwise direction crossing with the lengthwise direction and capable of generating capillary force such that, from among regions in which the plurality of vapor flow paths 12 provided between the regions in which the plurality of portions 11 are to be provided are to be formed, regions in which two vapor flow paths 12 adjacent to each other are to be formed are communicated with each other, form a third groove 24 extending in the widthwise direction and capable of generating capillary force in a region in which the liquid inlet side portion 10 is to be formed and form a first wide groove 15 having a width greater than those of the first groove 14 and the third groove 24 in a region in which the plurality of vapor flow paths 12 are to be formed and a region in which the vapor outlet side vapor flow path 13 is to be formed (for example, refer to FIGS. 13, 15 and 17).

Further, a region of the second plate-like member 23, in which the evaporator 2 is to be formed, is half etched to form a second groove 21 extending in the lengthwise direction and capable of generating capillary force in a region in which the plurality of portions 11 are to be formed, form, in a region continuing to the liquid inlet 8 included in the region in which the liquid inlet side portion 10 is to be formed and a region in which each of the plurality of portions 11 continues, a fourth groove 25 extending in the lengthwise direction and capable of generating capillary force and form, in a region in which the plurality of vapor flow paths 12 are to be formed and a region in which the vapor outlet side vapor flow path 13 is to be formed, a second wide groove 22 having a width greater than those of the second groove 21 and the fourth groove 25 (for example, refer to FIGS. 14 and 16).

Then, the first plate-like member 16 and the second plate-like member 23 are joined together such that the side having the first groove 14, third groove 24 and first wide groove 15 and the side having the second groove 21, fourth groove 25 and second wide groove 22 are opposed to each other.

The loop heat pipe 1 can be fabricated in this manner.

It is to be noted that, while a groove is not provided on any of the vapor line 4, condensation line 3A and liquid line 5 in the loop heat pipe 1 described above, the configuration is not limited to this.

Figure 18:
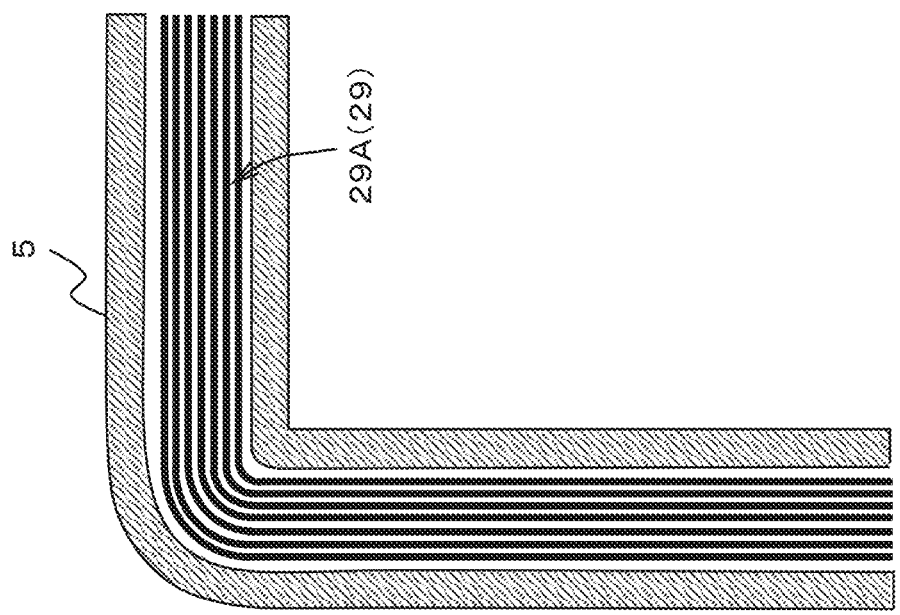
FIG. 18 is a schematic view depicting an example of a configuration where the liquid line provided in the loop heat pipe according to the embodiment includes a groove.
Figure 19:
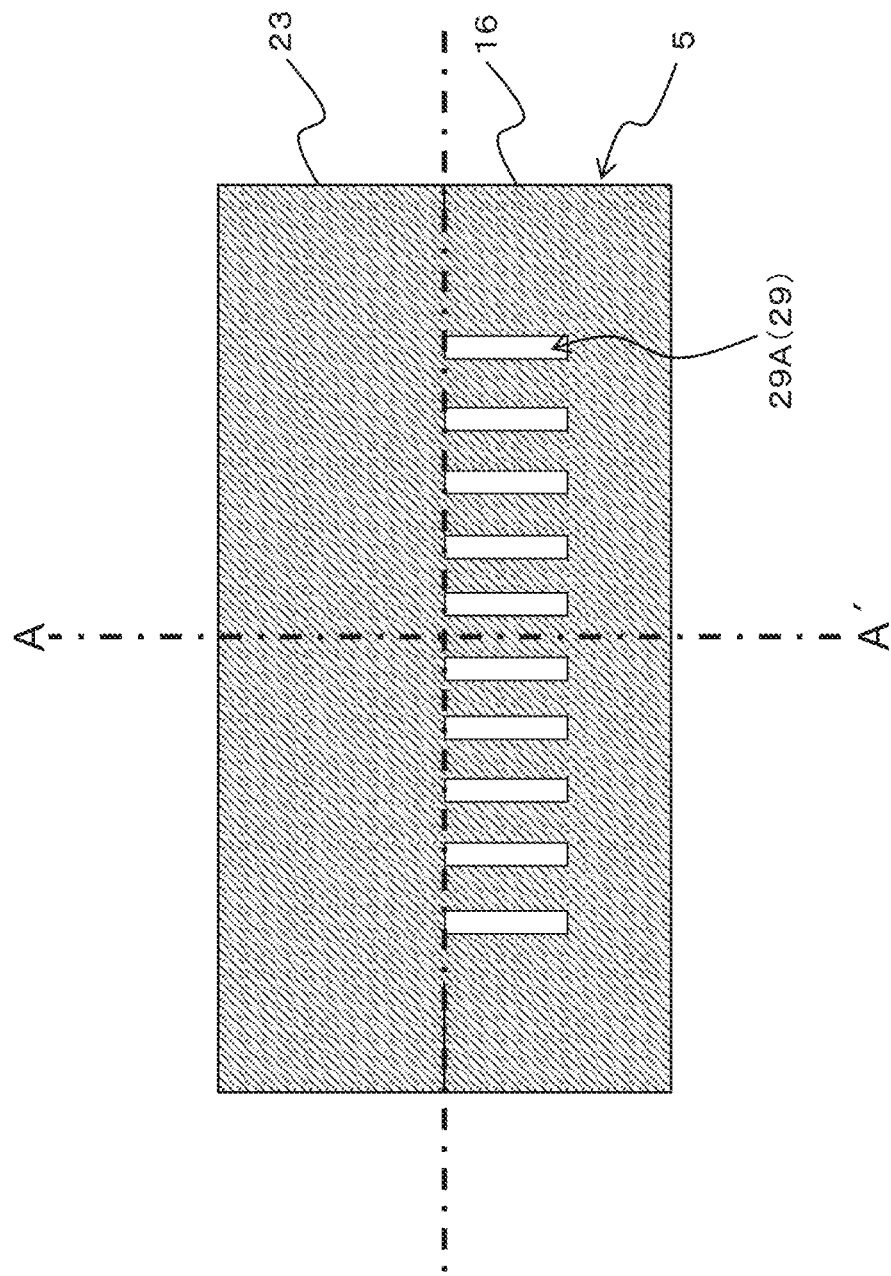
FIG. 19 is a schematic view depicting an example of a configuration where the liquid line provided in the loop heat pipe according to the embodiment includes a groove and is a sectional view taken along a widthwise direction of the liquid line.
Figure 20:
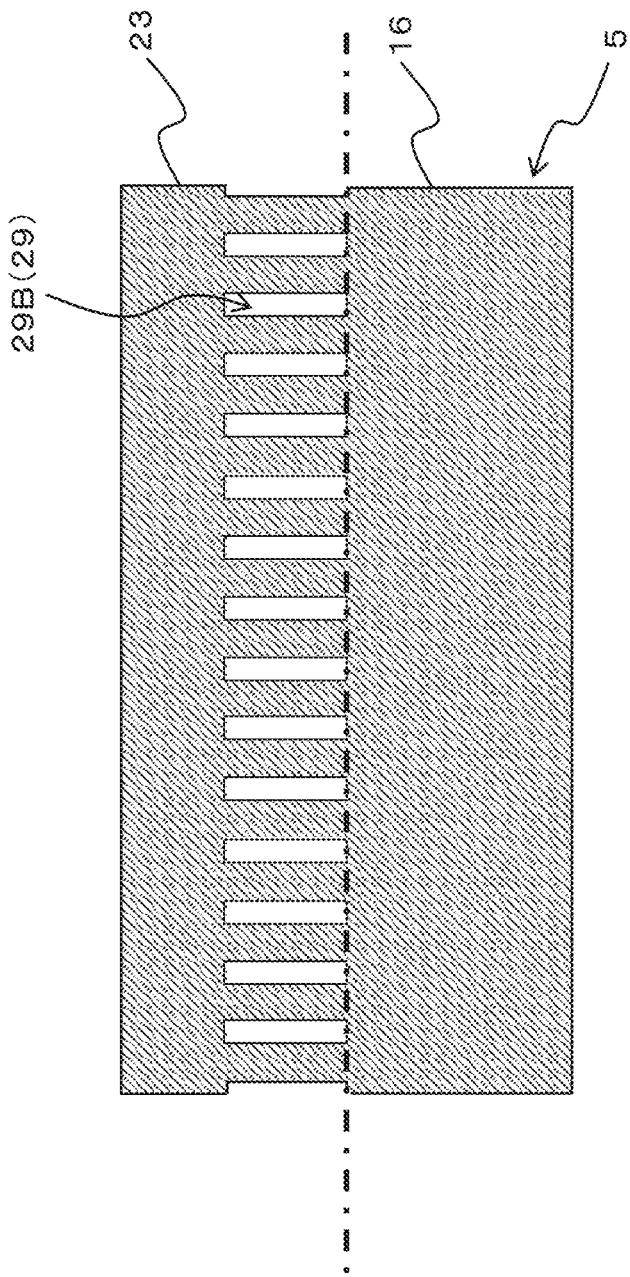
FIG. 20 is a schematic view depicting the example of a configuration where the liquid line provided in the loop heat pipe according to the embodiment includes a groove and is a sectional view taken along a lengthwise direction of the liquid line at a position indicated by a line A-A' of FIG. 19.

For example, as depicted in FIGS. 18 to 20, the liquid line 5 may be configured including a liquid line groove 29 capable of generating capillary force.

For example, as depicted in FIG. 18, a liquid line groove 29A extending in the lengthwise direction of the liquid line 5 and capable of generating capillary force may be provided on the liquid line 5.

In this case, the liquid line 5 may be structured such that a first liquid line groove 29A extending in the lengthwise direction of a region in which the liquid line 5 is to be formed and capable of generating capillary force is provided in a region of the first plate-like member 16 in which the liquid line 5 is to be formed and a second liquid line groove 29A extending in the lengthwise direction of the region in which the liquid line 5 is to be formed and capable of generating capillary force is provided in the region of the second plate-like member 23 in which the liquid line 5 is to be formed, and the first plate-like member 16 and the second plate-like member 23 are joined together such that the side having the first liquid line groove 29A and the side having the second liquid line groove 29A are opposed to each other.

Or, in a step of half etching the first plate-like member 16 in the fabrication method for a loop heat pipe described above, a region of the first plate-like member 16, in which the liquid line 5 is to be formed, is half etched to form a first liquid line groove 29A extending in the lengthwise direction of the region in which the liquid line 5 is to be formed and capable of generating capillary force, and, in a step of half etching the second plate-like member 23, a region of the second plate-like member 23, in which the liquid line 5 is to be formed, is half etched to form a second liquid line groove 29A extending in the lengthwise direction of the region in which the liquid line 5 is to be formed and capable of generating capillary force, whereafter, in a step of joining the first plate-like member 16 and the second plate-like member 23 together, the first plate-like member 16 and the second plate-like member 23 are joined together such that the side having the first groove 14, third groove 24, first wide groove 15 and first liquid line groove 29A and the side having the second groove 21, fourth groove 25, second wide groove 22 and second liquid line groove 29A are opposed to each other.

Further, the liquid line 5 may be configured including the first liquid line groove 29A extending in the lengthwise direction of the liquid line 5 and capable of generating capillary force and the second liquid line groove 29A extending in the widthwise direction of the liquid line 5 and capable of generating capillary force, for example, as depicted in FIGS. 19 and 20.

In this case, the liquid line 5 may be structured such that the first liquid line groove 29A extending in the lengthwise direction of the region in which the liquid line 5 is to be formed and capable of generating capillary force is provided in the region of the first plate-like member 16 in which the liquid line 5 is to be formed as depicted in FIG. 19 and the second liquid line groove 29B extending in the widthwise direction of the region in which the liquid line 5 is to be formed and capable of generating capillary force is provided in a region of the second plate-like member 23 in which the liquid line 5 is to be formed, and the first plate-like member 16 and the second plate-like member 23 are joined together such that the side having the first liquid line groove 29A and the side having the second liquid line groove 29B are opposed to each other.

Or, in the step of half etching the first plate-like member 16 in the fabrication method for a loop heat pipe described above, a first liquid line groove 29A extending in the lengthwise direction of a region in which the liquid line 5 is to be formed and capable of generating capillary force is formed by half etching a region of the first plate-like member 16 in which the liquid line 5 is to be formed and, in the step for half etching the second plate-like member 23, a second liquid line groove 29B extending in the widthwise direction of the region in which the liquid line 5 is to be formed and capable of generating capillary force is formed by half etching a region of the second plate-like member 23 in which the liquid line 5 is to be formed. Then, in the step of joining the first plate-like member 16 and the second plate-like member 23 together, the first plate-like member 16 and the second plate-like member 23 are joined together such that the side having the first groove 14, third groove 24, first wide groove 15 and first liquid line groove 29A and the side having the second groove 21, fourth groove 25, second wide groove 22 and second liquid line groove 29B are opposed to each other.

Further, for example, the liquid line 5 may be configured including a wick in place of the liquid line groove 29. In this case, a wick having a configuration similar to that of the wick 20 provided in the evaporator 2 described above may be provided also on the liquid line 5.

It is to be noted that the liquid line groove 29 or the wick may be provided over the overall liquid line 5 or may be provided at part of the liquid line 5. Further, the number, distance and shape of the liquid line grooves 29 are not limited to those exemplified here.

The reason why a liquid line groove 29 or a wick capable of generating capillary force is provided also on the liquid line 5 as described above is that, although a mobile device is sometimes placed in a vertical orientation in which the position of the heat-generating component 7 that is a heat source is positioned at the upper side, also in such a case as just described, capillary force acts such that working fluid of the liquid phase flows in a part of the liquid line 5 and flows into the evaporator 2 thereby to allow the loop heat pipe 1 to operate in stability.

In the following, a particular example of a configuration and a fabrication method of the same are described below.

Figure 21A:
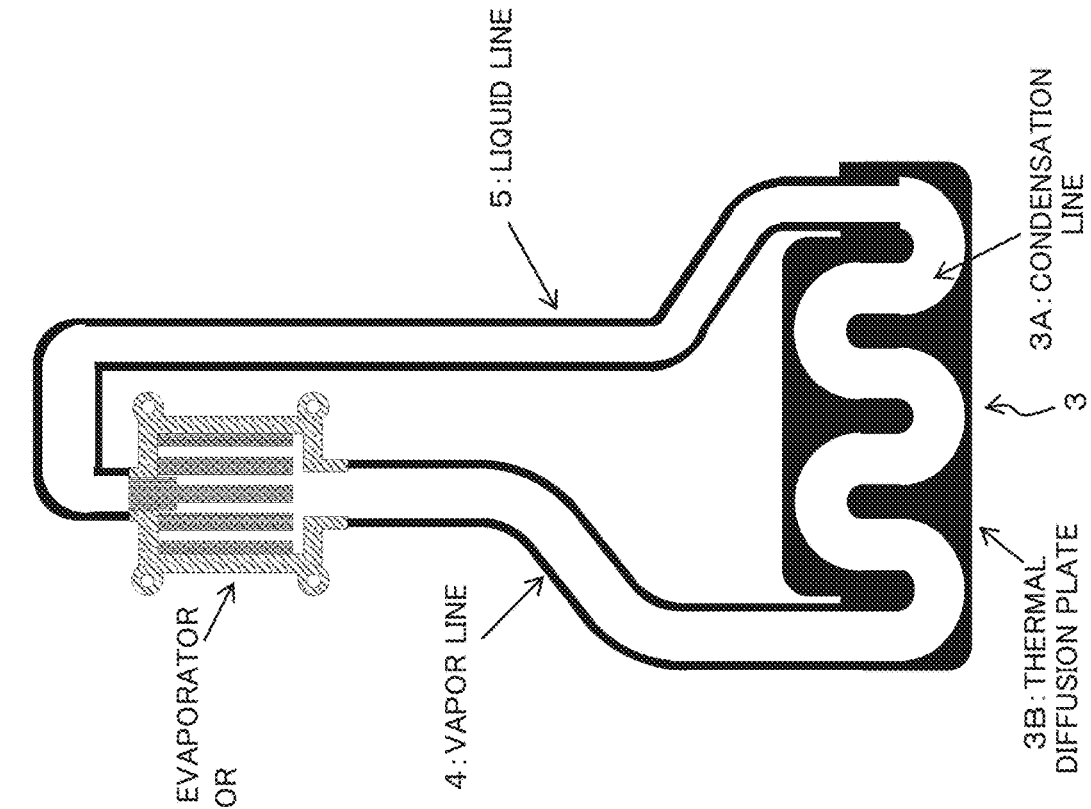
FIGS. 21A and 21B are schematic views illustrating a particular example of a configuration of the loop heat pipe according to the embodiment and a fabrication method for the loop heat pipe.

First, one thin copper plate having a thickness of approximately 3 mm is used and patterned with resist and etched such that such a shape as depicted in FIG. 21A is obtained. Here, the width of the vapor line 4 and the condensation line 3A provided on the condenser 3 is approximately 8 mm, and the width of the liquid line 5 is approximately 6 mm. Further, the flow paths of the vapor line 4, condensation line 3A and liquid line 5 are formed by performing half etching of a thin copper plate to the depth of approximately 0.15 mm. Further, the inside of the evaporator 2 is formed by half etching such that such a pattern as depicted in FIG. 21A is formed. Here, the width and the depth of the fine grooves that are the first groove 14 and the third groove 24 (for example, refer to FIGS. 13, 15 and 17) are approximately 0.1 mm and approximately 0.12 mm, respectively. Further, the width and the depth of the groove that is the first wide groove 15 (for example, refer to FIGS. 13, 15 and 17) are approximately 1 mm and approximately 0.15 mm, respectively. It is to be noted that, in FIG. 21A, a pattern is applied to the regions in which the first groove 14 and the third groove 24 are to be provided.

Figure 21B:
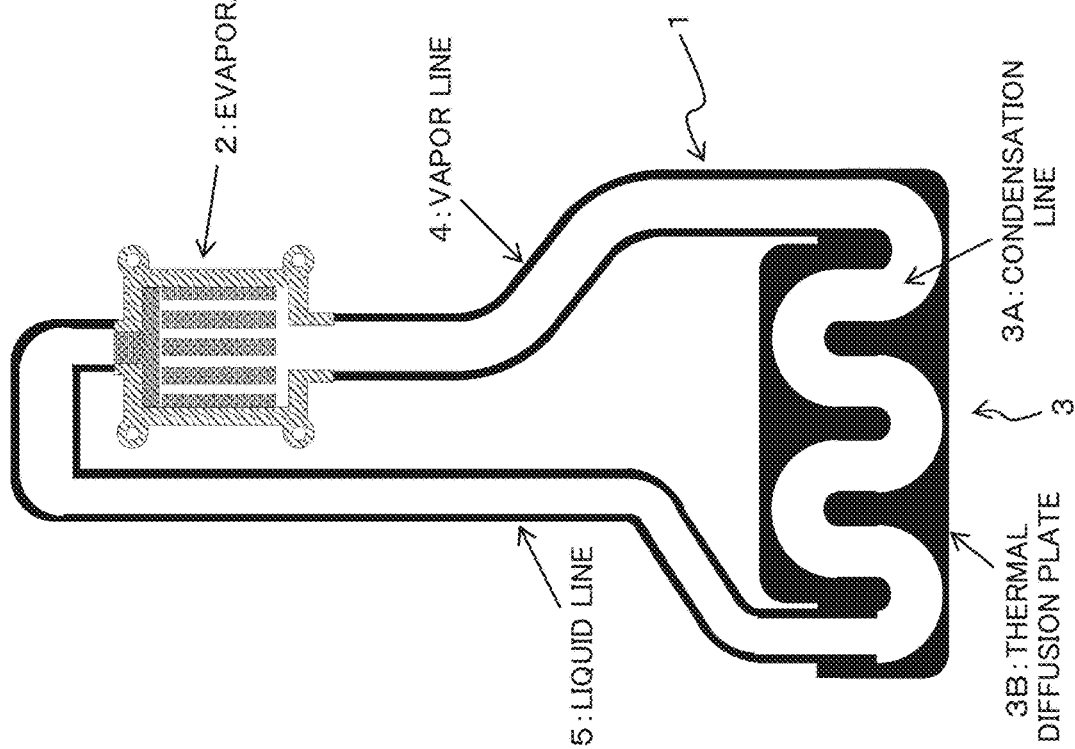

Then, one thin copper plate having a thickness of approximately 3 mm is patterned with resist and etched such that such a shape as depicted in FIG. 21B is obtained. Here, the thin copper plate processed to such a shape as depicted in FIG. 21A is processed such that the evaporator 2, vapor line 4, condenser 3 and liquid line 5 are disposed at symmetric positions. Here, the width of the vapor line 4 and the condensation line 3A provided on the condenser 3 is approximately 8 mm and the width of the liquid line 5 is approximately 6 mm. Further, the flow paths of the vapor line 4, condensation line 3A and liquid line 5 are formed by half etching the thin copper plate to a depth of approximately 0.15 mm. Further, the inside of the evaporator 2 is formed by half etching such that such a pattern as depicted in FIG. 21B is formed. Here, the width and the depth of the fine grooves that are the second groove 21 and the fourth groove 25 (for example, refer to FIGS. 14 and 16) are approximately 0.1 mm and approximately 0.12 mm, respectively. Further, the width and the depth of the groove that is the second wide groove 22 (for example, refer to FIGS. 14 and 16) are approximately 1 mm and approximately 0.15 mm, respectively. It is to be noted in FIG. 21B, a pattern is applied to the regions in which the second groove 21 and the fourth groove 25 are to be provided.

Then, the loop heat pipe 1 can be produced by diffusion bonding the thin copper plate processed in such a manner as depicted in FIG. 21A and the thin copper plate processed in such a manner as depicted in FIG. 21B, pumping the inside into vacuum through a liquid inlet and then injecting water (or ethanol or Freon) into the pipe.

Figure 22:
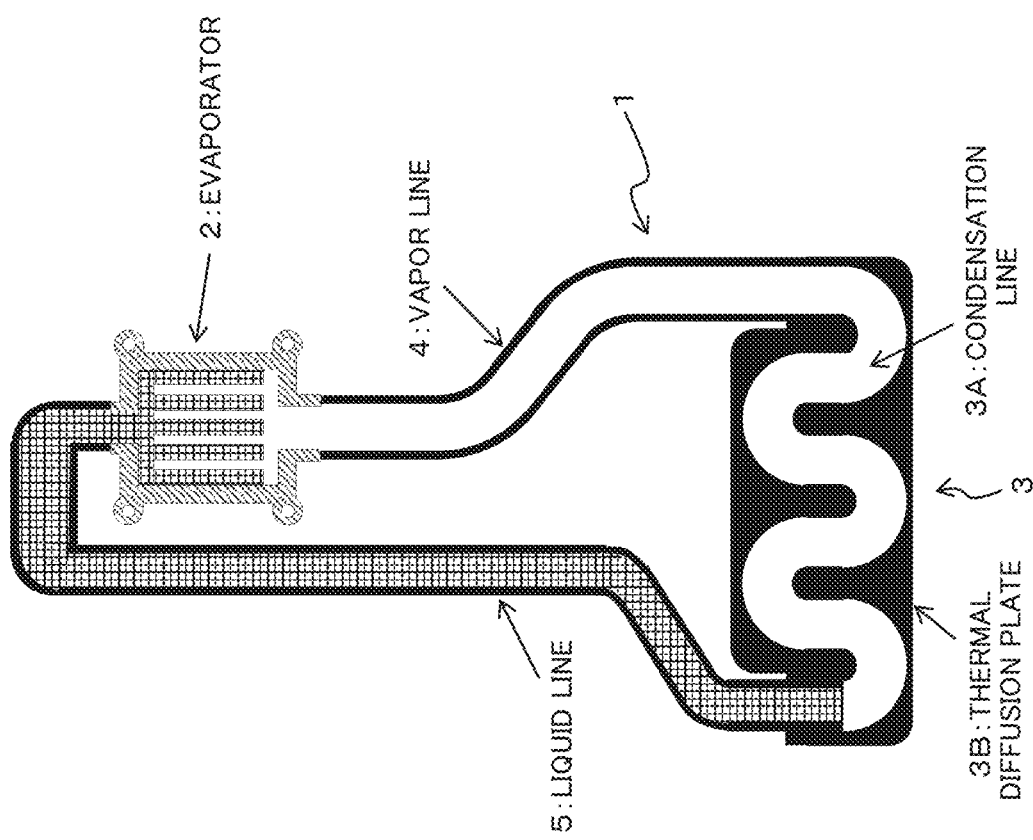
FIG. 22 is a schematic view depicting an example of a configuration where the liquid line provided in the loop heat pipe according to the embodiment includes a groove.

It is to be noted that, in order to form a liquid line groove 29 capable of generating capillary force also in the inside of the liquid line 5 as depicted in FIG. 22 in the loop heat pipe 1 fabricated in such a manner as described above, the liquid line groove 29 may be formed by half etching in the region of each thin copper plate in which the liquid line 5 is to be formed. In this case, the liquid line groove 29A extending in the lengthwise direction of the liquid line 5 may be formed in the region of both of the thin copper plates in which the liquid line 5 is to be formed, or the liquid line groove 29A extending in the lengthwise direction of the liquid line 5 may be formed in the region of one of the thin copper plates in which the liquid line 5 is to be formed while the liquid line groove 29B extending in the widthwise direction of the liquid line 5 is formed in the region of the other thin copper plate in which the liquid line 5 is to be formed. Here, the width and the depth of the liquid line grooves 29 may be set to approximately 0.1 mm and approximately 0.12 mm, respectively. It is to be noted that, in FIG. 22, a pattern is applied to regions in which the first groove 14 and the third groove 24 are to be provided and a region in which the liquid line groove 29 is to be provided.

Further, the shape and the piping layout of the loop heat pipe 1 are not limited to those described above. Further, while a thin copper plate is used as the thin metal plate here, the thin metal plates may be formed collectively by diffusion bonding. Further, the material of any thin metal plate is not limited to copper, and a material for pattern formation by etching or the like and diffusion bonding may be used. Further, the dimensions of the loop heat pipe 1 are not limited to those described above and may be optimized suitably in accordance with a required heat transport amount and a required heat transfer distance, a piping height and a piping width.

Since, in the loop heat pipe 1 produced in such a manner as described above, the vapor flow paths 12 adjacent to each other from among the plurality of vapor flow paths 12 are communicated with each other by a fine groove that is the first groove 14, the pressure distribution in the evaporator 2 upon vapor generation disappears and working fluid of the vapor phase is evacuated uniformly to the vapor line 4, and, as a result, the start-up time period of the loop heat pipe 1 can be reduced.

Figure 23:
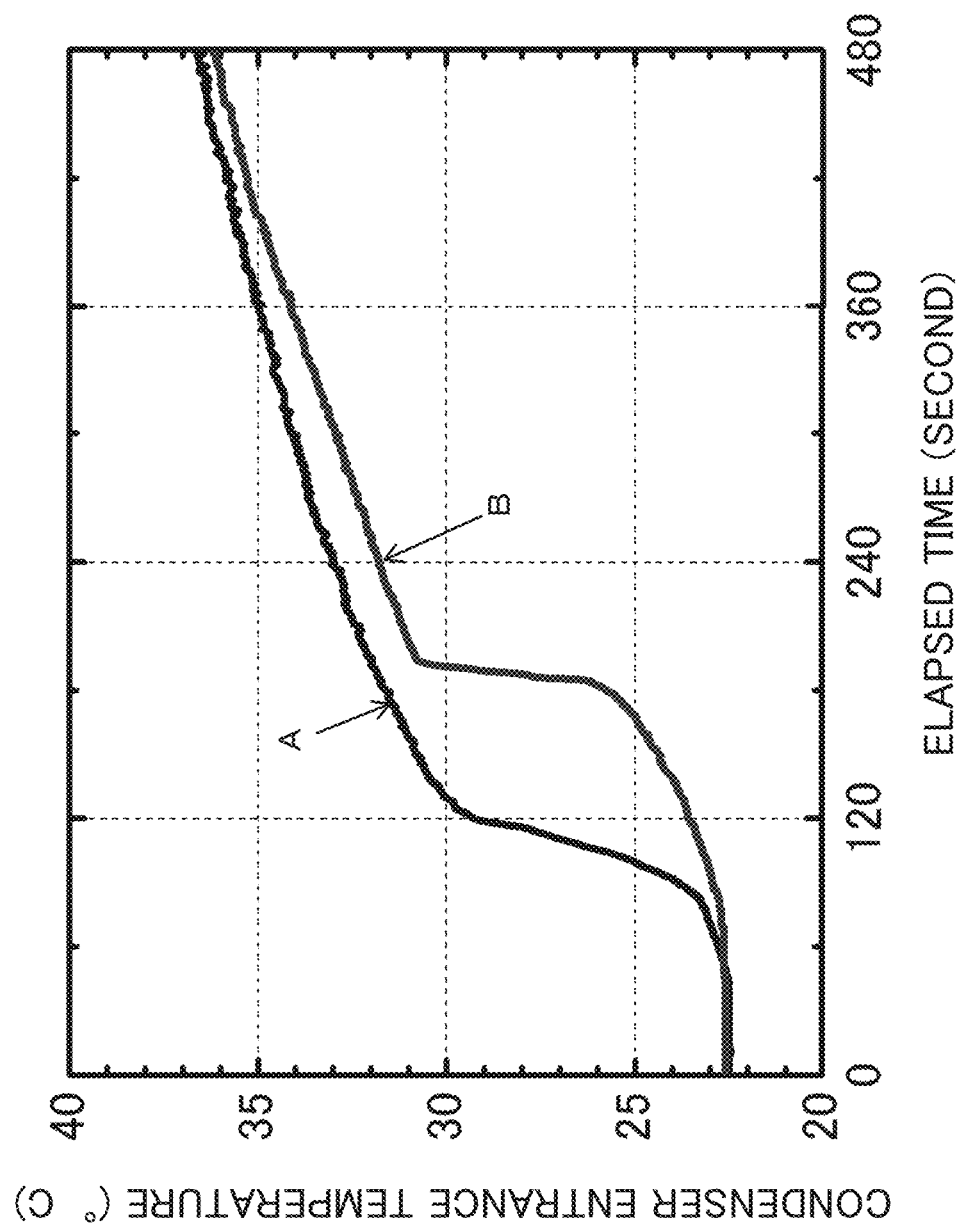
FIG. 23 is a view depicting a temperature profile at an inlet of the condenser of the loop heat pipe where the loop heat pipe, in which two thin metal plates are used, according to the embodiment is started.

Here, FIG. 23 depicts profiles of an inlet temperature of the condenser 3 upon start-up of the loop heat pipe 1 of the embodiment described hereinabove and a comparative example.

Here, in FIG. 23, a solid line A indicates a profile of the inlet temperature of the condenser 3 of the loop heat pipe 1 of the embodiment described above, namely, of the loop heat pipe 1 that is configured from two thin metal plates in such a manner as described above and in which the first groove 14, second groove 21, third groove 24 and fourth groove 25 are provided in the evaporator 2. Further, in FIG. 23, a solid line B indicates a profile of the inlet temperature of the condenser of the loop heat pipe of the comparative example, namely, the loop heat pipe that is configured from six thin metal plates and in which the wick is provided in the evaporator while the first groove, second groove, third groove and fourth groove are not provided.

As depicted in FIG. 23, while, in the loop heat pipe of the comparative example, the time period after heat is applied to the evaporator until the temperature of the inlet of the condenser rises is approximately 190 seconds, in the loop heat pipe 1 or the embodiment described above, the time period is reduced to approximately 120 seconds. In this manner, with the loop heat pipe 1 of the embodiment described hereinabove, the start-up time period can be reduced in comparison with that of the loop heat pipe of the comparative example. By reducing the start-up time period of the loop heat pipe 1 in this manner, the heat of an LSI chip (heat-generating component) that is a heat source such as, for example, a CPU can be transferred in a short period of time, and this provides an effect that thermal runaway arising from a sudden rise of the temperature of the LSI is suppressed and function restriction of the LSI chip for suppressing an excessive increase of the temperature is delayed. As a result, an operation and a use sense comfortable to the user of the mobile device 6 can be implemented.

Accordingly, with the loop heat pipe and the fabrication method for the loop heat pipe, and the electronic device according to the embodiment, there is an advantage that the start-up time period for heat transfer can be reduced in the loop heat pipe 1 in which the evaporator 2 is reduced in thickness.

Figure 24:
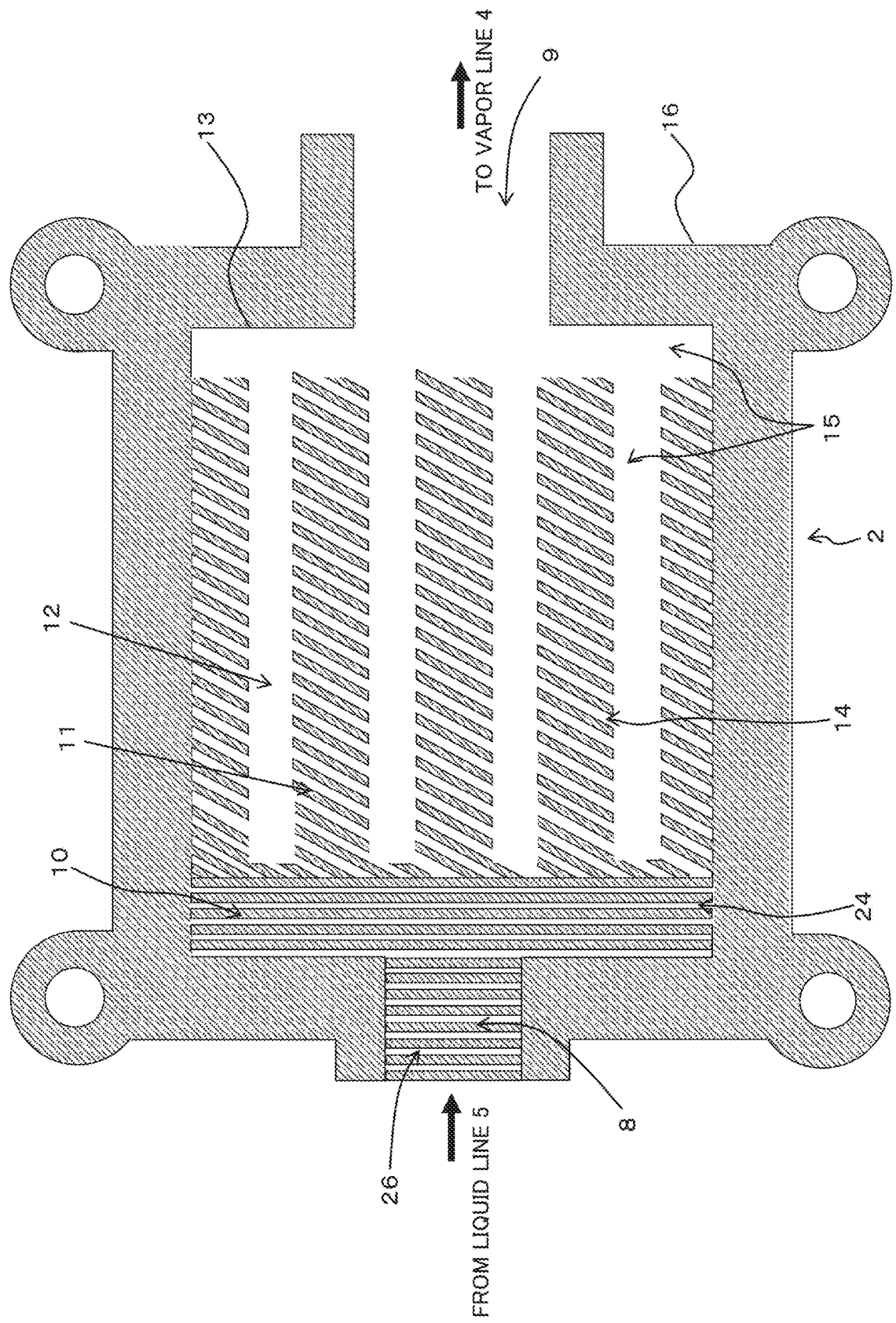
FIG. 24 is a schematic view depicting an example of a configuration of the evaporator provided in the loop heat pipe according to the embodiment.

It is to be noted that, while, in the embodiment described above, the first groove 14 is provided such that it extends in a direction orthogonal to the direction in which the plurality of vapor flow paths 12 extend and the direction in which the plurality of vapor flow paths 12 extend and the direction in which the first groove 14 extends cross with each other (for example, refer to FIG. 13), the configuration is not limited to this, and the first groove 14 may be provided such that it communicates two vapor flow paths 12 adjacent to each other from among the plurality of vapor flow paths 12. For example, as depicted in FIG. 24, the first groove 14 may be provided such that it extends in an oblique direction with respect to the direction in which the plurality of vapor flow paths 12 extend and the direction in which the plurality of vapor flow paths 12 extend and the direction in which the first groove 14 extends cross with each other.

Figure 25:
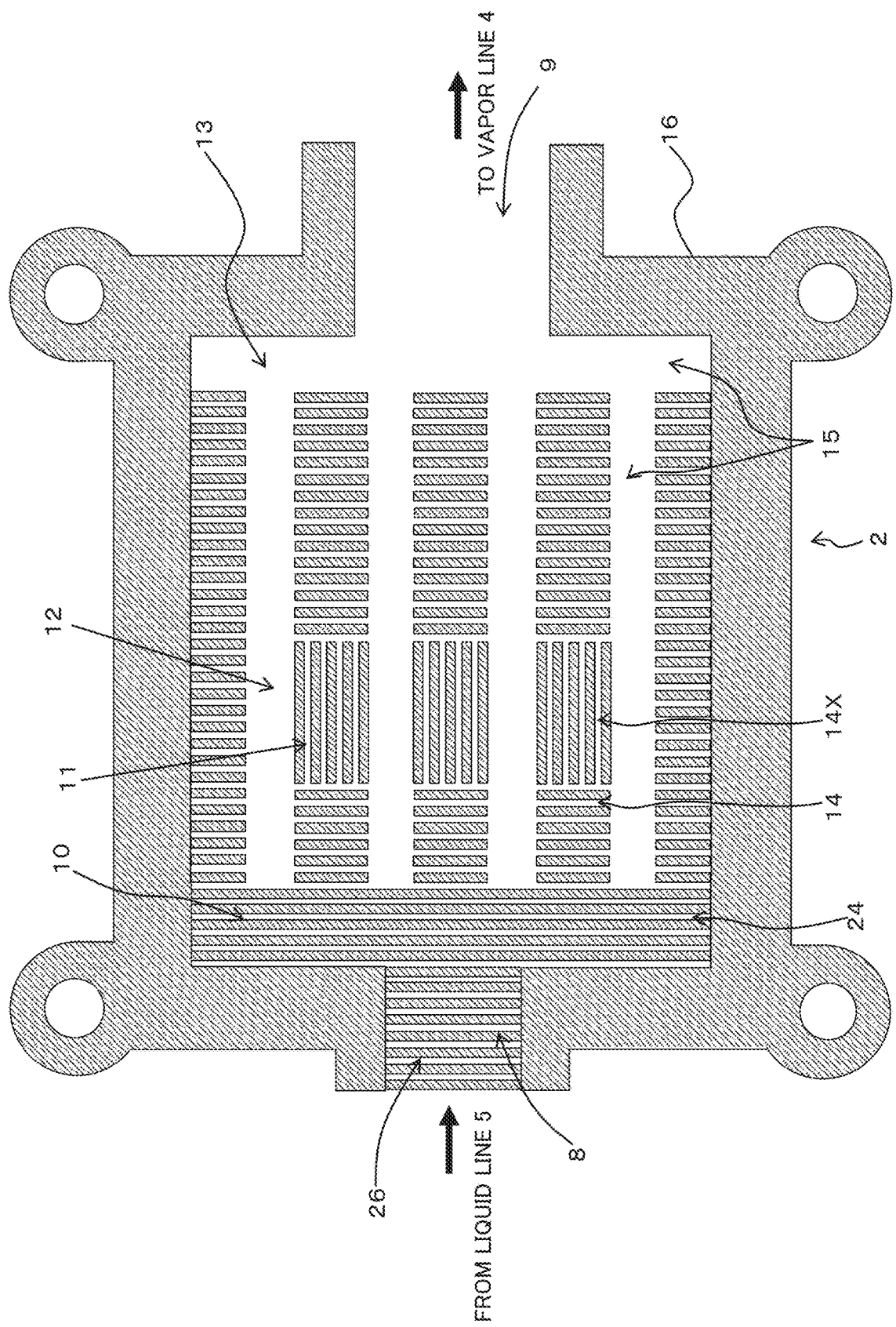
FIG. 25 is a schematic view depicting an example of a configuration of the evaporator provided in the loop heat pipe according to the embodiment.

Further, while, in the embodiment described above, as the first groove provided individually at the plurality of portions 11, the plurality of grooves 14 extending in the widthwise direction are provided in a parallel and juxtaposed relationship with each other in the lengthwise direction (for example, refer to FIG. 13), the plurality of grooves 14 may not necessarily be provided over the overall length in the lengthwise direction, and, for example, a plurality of grooves 14X extending in the lengthwise direction may be provided in a parallel and juxtaposed relationship to each other in the widthwise direction at part in the lengthwise direction as depicted in FIG. 25. In particular, the plurality of grooves 14 extending in the widthwise direction and the plurality of grooves 14X extending in the lengthwise direct ion may be provided as the first grooves provided individually at the plurality of portions 11. Here, the plurality of grooves 14 extending in the widthwise direction and the plurality of grooves 14X extending in the lengthwise direction are provided so as to be orthogonal to each other.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A fabrication method for a loop heat pipe, comprising:
processing a region of a first plate member, in which an evaporator is to be formed, to form, in a region in which a plurality of portions extending in a lengthwise direction from the side of a liquid inlet toward the side of a vapor outlet of the region serving as the evaporator are to be formed, a first groove extending in a widthwise direction crossing with the lengthwise direction and capable of generating capillary force such that, from among regions in which a plurality of vapor flow paths are to be formed provided between the regions in which the plurality of portions are to be formed, regions in which two vapor flow paths adjacent to each other are to be formed are communicated with each other, form, in a region in which a liquid inlet side portion is to be formed, a third groove extending in the widthwise direction and capable of generating capillary force and form a first wide groove having a width greater than those of the first groove and the third groove in the region in which the plurality of vapor flow paths are to be formed and a region in which a vapor outlet side vapor flow path is to be formed;

processing a region of a second plate member, in which the evaporator is to be formed, to form, in the region in which the plurality of portions are to be formed, a second groove extending in the lengthwise direction and capable of generating capillary force, form, in a region continuing to the liquid inlet and a region which each of the plurality of portions continues included in the region in which the liquid inlet side portion is to be formed, a fourth groove extending in the lengthwise direction and capable of generating capillary force, and form, in the region in which the plurality of vapor flow paths are to be formed and the region in which the vapor outlet side vapor flow path is to be formed, a second wide groove having a width greater than those of the second groove and the fourth groove; and joining the first plate member and the second plate member together such that the side having the first groove, third groove and first wide groove and the side having the second groove, fourth groove and second wide groove are opposed each other.

2. The fabrication method for a loop heat pipe according to claim 1, wherein, in the processing the first plate member, an etching process is performed for the region of the first plate member, in which a liquid line is to be formed, to form a first liquid line groove extending in a lengthwise direction of the region in which the liquid line is to be formed and capable of generating capillary force;

in the processing the second plate member, an etching process is performed for the region of the second plate member, in which the liquid line is to be formed, to form a second liquid line groove extending in a lengthwise direction of the region in which the liquid line is to be formed and capable of generating capillary force; and in the joining the first plate member and the second plate member together, the first plate member and the second plate member are joined together such that the side having the first groove, third groove, first wide groove and first liquid line groove and the side having the second groove, fourth groove, second wide groove and second liquid line groove are opposed to each other.

3. The fabrication method for a loop heat pipe according to claim 1, wherein, in the processing the first plate member; an etching process is performed for the region of the first plate member, in which a liquid line is to be formed, to form a first liquid line groove extending in a lengthwise direction of the region in which the liquid line is to be formed and capable of generating capillary force;

in the processing the second plate member, an etching process is performed for the region of the second plate member, in which the liquid line is to be formed, to form a second liquid line groove extending in a widthwise direction of the region in which the liquid line is to be formed and capable of generating capillary force; and in the joining the first plate member and the second plate member together, the first plate member and the second plate member are joined together such that the side having the first groove, third groove, first wide groove and first liquid line groove and the side having the second groove, fourth groove, second wide groove and second liquid line groove are opposed to each other.

* * * * *